(12) United States Patent
Lee et al.

(10) Patent No.: US 10,777,756 B2
(45) Date of Patent: Sep. 15, 2020

(54) FLEXIBLE DISPLAY APPARATUS

(71) Applicant: LG DISPLAY CO., LTD., Seoul (KR)

(72) Inventors: MinJic Lee, Gyeonggi-do (KR);
HongSik Kim, Gyeonggi-do (KR);
ChangSeung Woo, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/212,605

(22) Filed: Dec. 6, 2018

(65) Prior Publication Data

US 2019/0181363 A1    Jun. 13, 2019

(30) Foreign Application Priority Data

Dec. 11, 2017    (KR) .................. 10-2017-0169429

(51) Int. Cl.
| | | |
|---|---|---|
| *H05K 1/00* | (2006.01) | |
| *H01L 51/00* | (2006.01) | |
| *H01L 27/32* | (2006.01) | |
| *G09F 9/30* | (2006.01) | |
| *G09G 3/3266* | (2016.01) | |
| *H01L 51/52* | (2006.01) | |

(52) U.S. Cl.
CPC .......... *H01L 51/0097* (2013.01); *G09F 9/301* (2013.01); *G09G 3/3266* (2013.01); *H01L 27/3246* (2013.01); *H01L 27/3276* (2013.01); *H01L 51/5218* (2013.01); *H01L 51/5234* (2013.01); *H01L 51/5237* (2013.01); *G09G 2380/02* (2013.01); *H01L 2251/5338* (2013.01)

(58) Field of Classification Search
CPC .. G09F 9/301; G09G 2380/02; G09G 3/3266; H01L 2251/5338; H01L 27/3246; H01L 27/3276; H01L 51/0097; H01L 51/5218; H01L 51/5234; H01L 51/5237
See application file for complete search history.

(56) References Cited

U.S. PATENT DOCUMENTS

| | | | | |
|---|---|---|---|---|
| 6,177,293 B1 * | 1/2001 | Netzer | ............. | H01L 27/14609 257/E27.131 |
| 8,325,159 B2 * | 12/2012 | Kent | .................... | G06F 3/0436 345/177 |
| 9,013,433 B2 * | 4/2015 | Kang | .................... | G06F 1/1626 345/173 |

(Continued)

FOREIGN PATENT DOCUMENTS

| | | |
|---|---|---|
| EP | 2 980 854 A1 | 2/2016 |
| KR | 20170045393 A | 4/2017 |
| WO | 2018-138779 A1 | 2/2018 |

*Primary Examiner* — Yuriy Semenenko
(74) *Attorney, Agent, or Firm* — Polsinelli PC

(57) ABSTRACT

Disclosed is a flexible display apparatus in which a bending area bent with respect to a bending line disposed in a first direction is provided, and even when the flexible display apparatus is folded with respect to a folding line provided in a second direction intersecting the first direction, a crack does not occur. The flexible display apparatus includes a cover substrate and a display module disposed on a rear surface of the cover substrate to display an image. Also, the flexible display apparatus includes a flat part, a first bending part bent at a first curvature from a first side of the flat part with respect to a first bending line, and a folding part folded with respect to a folding line. The folding part does not overlap the first bending part.

18 Claims, 18 Drawing Sheets

(56) References Cited

U.S. PATENT DOCUMENTS

| | | | |
|---|---|---|---|
| 2005/0045927 A1* | 3/2005 | Li | H01L 27/14627 257/294 |
| 2005/0073505 A1* | 4/2005 | Katsuki | G06F 3/0436 345/173 |
| 2014/0285992 A1 | 9/2014 | Yang et al. | |
| 2014/0368782 A1* | 12/2014 | Kim | G02F 1/133305 349/153 |
| 2015/0109544 A1* | 4/2015 | Yeo | G02F 1/133305 349/12 |
| 2017/0003716 A1* | 1/2017 | Chong | H04N 5/23293 |
| 2019/0049599 A1* | 2/2019 | Matsumoto | H01L 25/041 |

* cited by examiner

FLEXIBLE DISPLAY APPARATUS

CROSS REFERENCE TO RELATED APPLICATION

This application claims the benefit of the Korean Patent Application No. 10-2017-0169429 filed on Dec. 11, 2017, which is hereby incorporated by reference in its entirety as if fully set forth herein.

BACKGROUND

Field of the Disclosure

The present disclosure relates to a flexible display apparatus.

Description of the Background

With the advancement of information-oriented society, various requirements for display apparatuses for displaying an image are increasing. Various display apparatuses such as liquid crystal display (LCD) apparatuses and light emitting display apparatuses have been commercialized. Light emitting display apparatuses may be categorized into organic light emitting display apparatuses, which use an organic light emitting layer as a light emitting element, and light emitting diode display apparatuses which use a micro light emitting diode as a light emitting element. Light emitting display apparatuses are driven with a low voltage and have a thin profile, an excellent viewing angle, and a fast response time.

Since light emitting display apparatuses do not need a backlight, research for developing flexible display apparatuses having flexibility are being done recently. The flexible display apparatuses each include a pixel array layer which is provided on a flexible substrate having flexibility and includes a plurality of thin film transistors (TFTs) and a plurality of lines, and since the flexible display apparatuses display an image even when being bent or folded, the flexible display apparatuses may be applied to various fields. The flexible display apparatuses may be categorized into curved display apparatuses, which are bent at a certain curvature, and foldable display apparatuses which are folded to an inner side or an outer side.

FIG. 1 is an exemplary diagram illustrating a curved display apparatus where both edges are bent. The curved display apparatus FD of FIG. 1 includes a cover substrate CG and a display module DM. Referring to FIG. 1, the both edges of the curved display apparatus facing each other may be bent at a certain curvature with respect to bending lines BL1 and BL2 which are provided in a first direction (a X-axis direction). In this case, when the curved display apparatus is folded with respect to folding line FL which is provided in a second direction (an Z-axis direction) intersecting the first direction (the Z-axis direction), cracks occurs in the both edges which are bent at the certain curvature. That is, it is difficult to implement a curved display apparatus, which is bent with respect to a bending line including at least one edge provided in the first direction, as a foldable display apparatus capable of being folded with respect to a folding line provided in the second direction.

SUMMARY

Accordingly, the present disclosure is directed to provide a flexible display apparatus that substantially obviates one or more problems due to limitations and disadvantages of the related art.

An aspect of the present disclosure is directed to provide a flexible display apparatus in which a bending area bent with respect to a bending line disposed in a first direction is provided, and even when the flexible display apparatus is folded with respect to a folding line provided in a second direction intersecting the first direction, a crack does not occur.

In addition to the aforesaid of the present disclosure, other features and advantages of the present disclosure will be described below, but will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a flexible display apparatus including a cover substrate and a display module disposed on a rear surface of the cover substrate to display an image, the flexible display apparatus including a flat part, a first bending part bent at a first curvature from a first side of the flat part with respect to a first bending line, and a folding part folded with respect to a folding line, wherein the folding part does not overlap the first bending part.

In another aspect of the present disclosure, A flexible display apparatus including a display module disposed on a rear surface of a cover substrate comprises a flat part having a first side and a second side; a first bending part bent at a first curvature from the first side of the flat part with respect to a first bending line; a second bending bent at a second curvature from the second side of the flat part with respect to a second bending line; and a folding part foldable with respect to a first folding line and a second folding line and having a concave portion separating the first and second bending part from each other.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
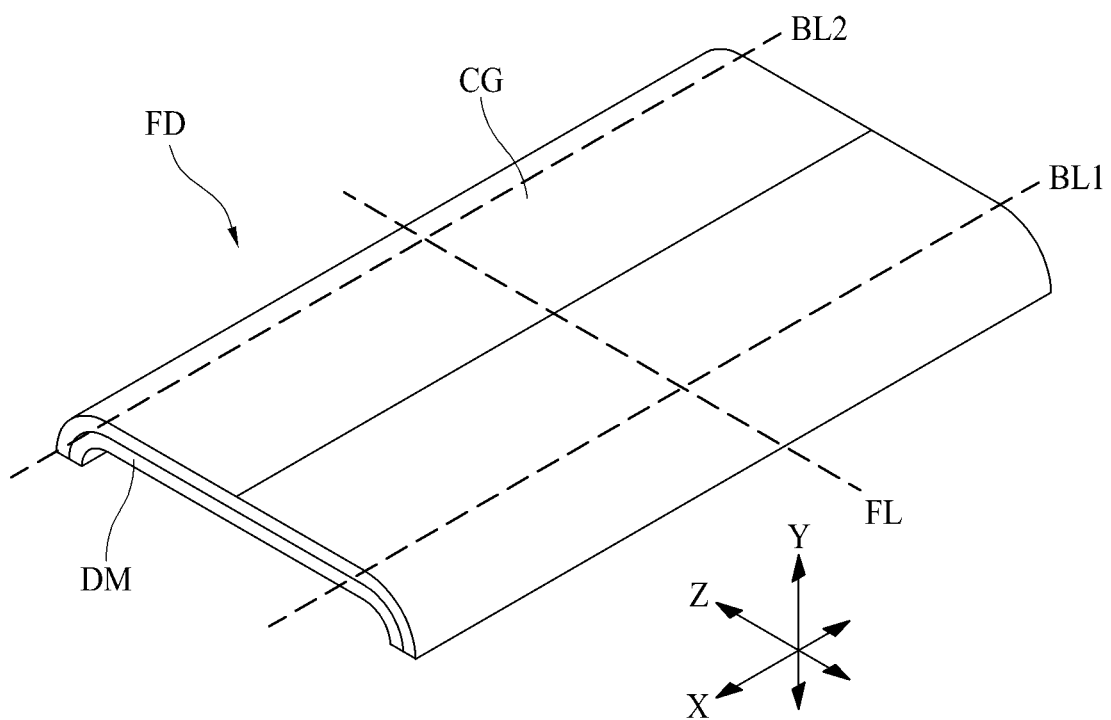
FIG. 1 is an exemplary diagram illustrating a curved display apparatus where both edges are bent.

Reference will now be made in detail to the exemplary aspects of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

Figure 2:
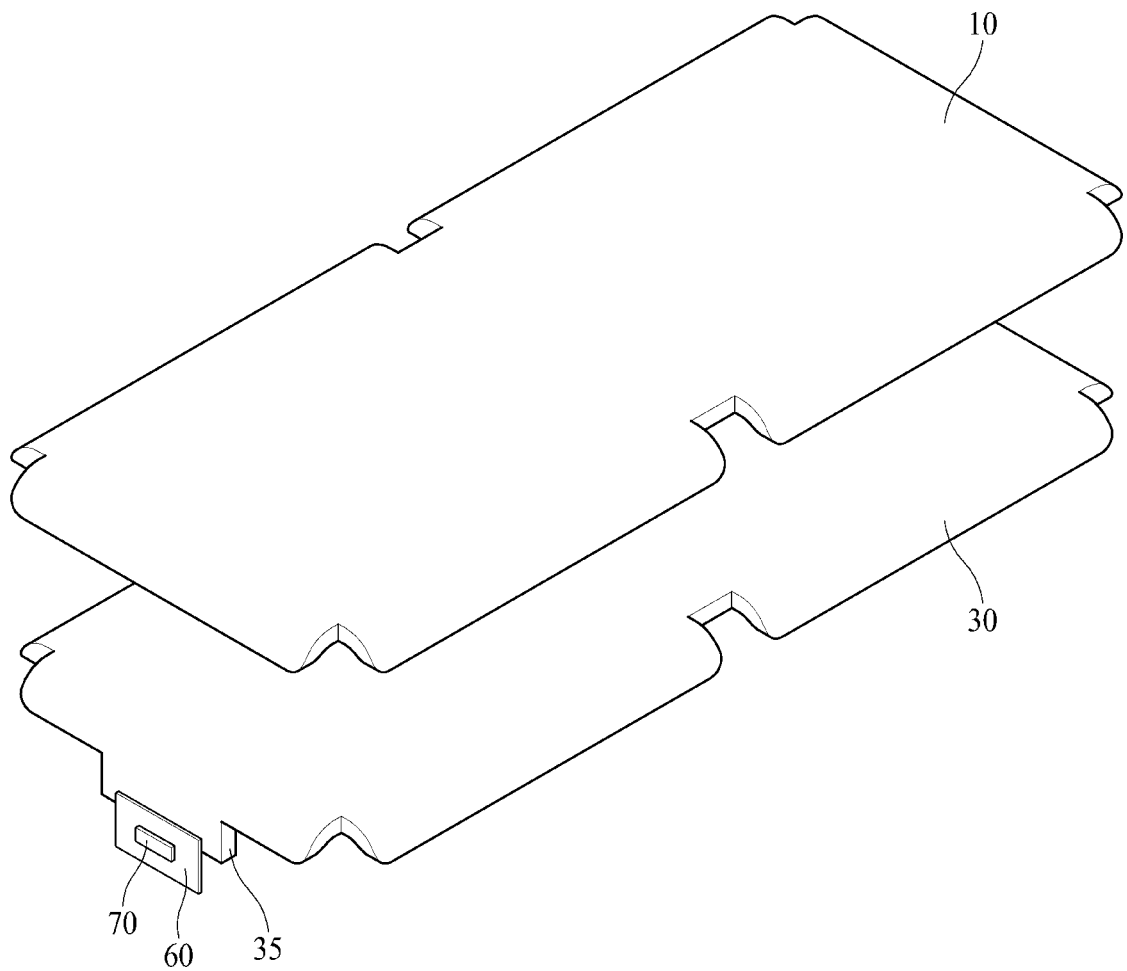
FIG. 2 is an exploded perspective view illustrating a flexible display apparatus according to an aspect of the present disclosure.
Figure 3A:
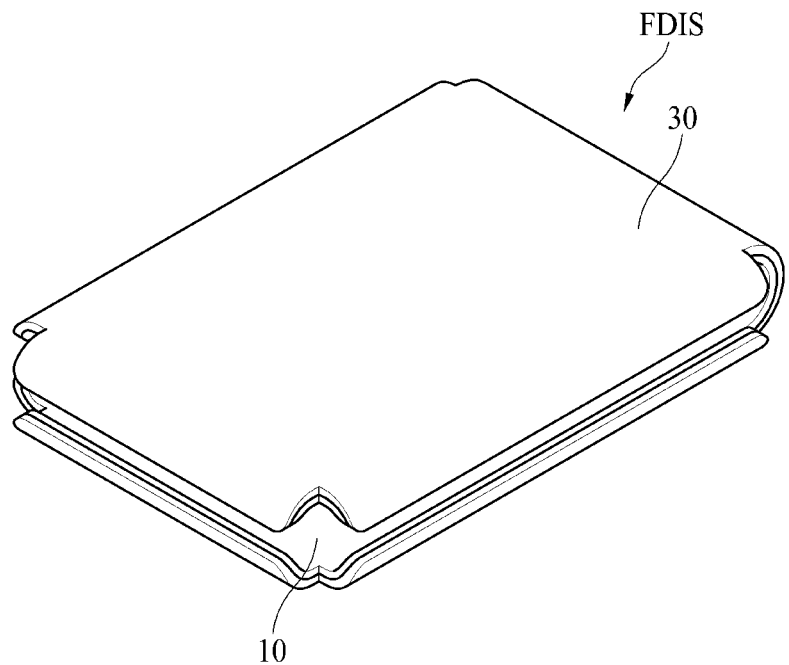
FIGS. 3A and 3B are perspective views illustrating a flexible display apparatus folded in an inward direction and an outward direction, according to an aspect of the present disclosure.
Figure 3B:
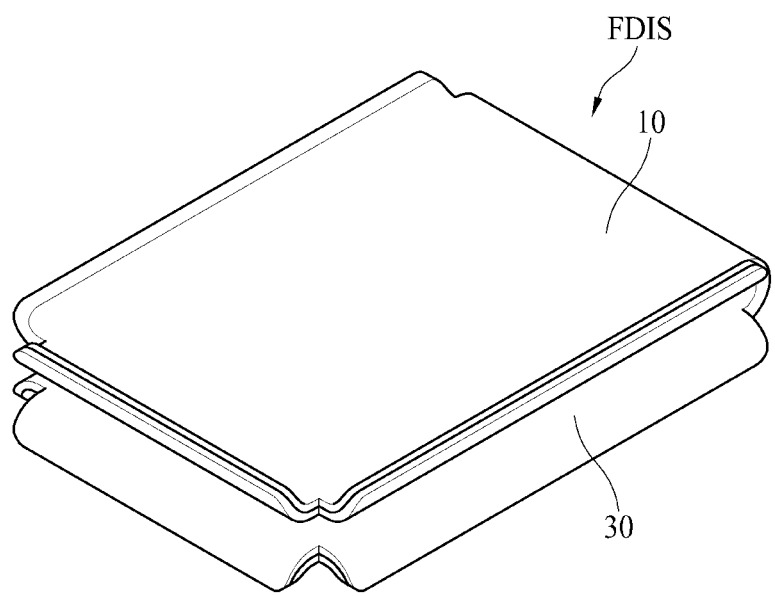

FIG. 2 is an exploded perspective view illustrating a flexible display apparatus FDIS according to an aspect of the present disclosure. FIGS. 3A and 3B are perspective views illustrating the flexible display apparatus FDIS folded in an inward direction and an outward direction, according to an aspect of the present disclosure.

Referring to FIGS. 2, 3A, and 3B, the flexible display apparatus FDIS according to an aspect of the present disclosure may include a cover substrate 10, a display module 30, a flexible film 60, and an integration driving circuit 70.

The cover substrate 10 may be formed of plastic, glass, and/or the like. The cover substrate 10 may include a flat part, at least one bending part which is bent at a certain curvature, and at least one folding part where a plurality of folding lines enabling the cover substrate 10 to be folded are provided.

The flat part may be flatly provided in a center region of the cover substrate 10.

The at least one bending part may be provided in at least one edge of the cover substrate 10. In FIG. 2, the at least one bending part is illustrated as being provided in four edges of the cover substrate 10, but aspects of the present disclosure are not limited thereto. That is, in aspects of the present disclosure, the at least one bending part may be provided in one edge, two edges, or three edges of the cover substrate 10.

The at least one folding part may be provided in the flat part. The at least one folding part may not overlap the at least one bending part. The flexible display apparatus FDIS may be folded in an inward direction as in FIG. 3A or in an outward direction as in FIG. 3B, with respect to the folding lines.

The flat part, the at least one bending part, and the at least one folding part of the cover substrate 10 will be described in detail with reference to FIG. 4.

The cover substrate 10 may include a decoration layer. The decoration layer may be a layer including a pattern which is seen by a user even when the display module 30 does not display an image. The decoration layer may include a letter pattern or a color layer. The letter pattern may be a logo of a company such as "LG". The color layer may be provided in an area corresponding to a bezel area of the display module 30. In a case where the color layer is provided in black, when the display module 30 does not display an image, the color layer may be shown in the same color as that of a display area of the display module 30, and thus, a screen of the display module 30 is widely seen by a user.

The display module 30 may be disposed on a rear surface of the cover substrate 10. The display module 30 may be a display apparatus which displays an image. For example, the display module 30 may be a light emitting display apparatus, but aspects of the present disclosure are not limited thereto. Examples of the light emitting display apparatus may include organic light emitting display apparatuses, where an organic light emitting layer is used as a light emitting element, and light emitting diode display apparatuses where a micro light emitting diode is used as a light emitting element.

The display module 30 may be attached on a rear surface of the cover substrate 10 by an adhesive film. The adhesive film may be an optically cleared resin (OCR) or an optically cleared adhesive (OCA) film.

A polarization film may be disposed on a front surface of the display module 30. The polarization film prevents visibility from being reduced due to reflection of external light.

A heat dissipation film may be disposed on a rear surface of the display module 30. The heat dissipation film may include a material having high thermal conductivity so as to effectively dissipate heat occurring in the display module 30. Also, the heat dissipation film may perform a buffering function for protecting the display module 30 from an external impact.

The display module 30 may be disposed in the flat part, the at least one bending part, and the at least one folding part of the cover substrate 10. Since the display module 30 is also disposed in the at least one bending part of the cover substrate 10, a user may look at an image through the at least one bending part of the cover substrate 10.

The display module 30 may include a protrusion 35 which protrudes from at least a portion of a component of the display module 30. For example, as in FIG. 2, the protrusion 35 may protrude from a portion of a lower side constituting the display module 30. The flexible film 60 may be attached on the protrusion 35, and in order to minimize a bezel area, the protrusion 35 and the flexible film 60 may be bent and fixed to the rear surface of the display module 30. The flexible film 60 may be a chip-on film (COF) with the integration driving circuit 70 mounted thereon.

The integration driving circuit 70 may be implemented as a chip type like an integrated chip (IC) and may be attached on the flexible film 60 in a COF type. The integration driving circuit 70 may be a driving circuit into which a data driving circuit, a timing control circuit, a power supply circuit, and a gamma voltage circuit are integrated.

The data driving circuit may be a circuit which generates data voltages from gamma voltages generated by the gamma voltage circuit and supplies the data voltages to data lines of the display module 30, and the timing control circuit may be a circuit which controls an operation timing of the data driving circuit and an operation timing of a scan driving circuit provided in the display module 30. The power supply circuit may be a circuit which generates and supplies driving voltages necessary for the data driving circuit, the timing control circuit, the gamma voltage circuit, and the scan driving circuit. Also, the power supply circuit may generate and supply a source voltage necessary for driving a light emitting element of the display module 30. The gamma voltage circuit may be a circuit which supplies the gamma voltages to the data driving circuit.

Figure 4:
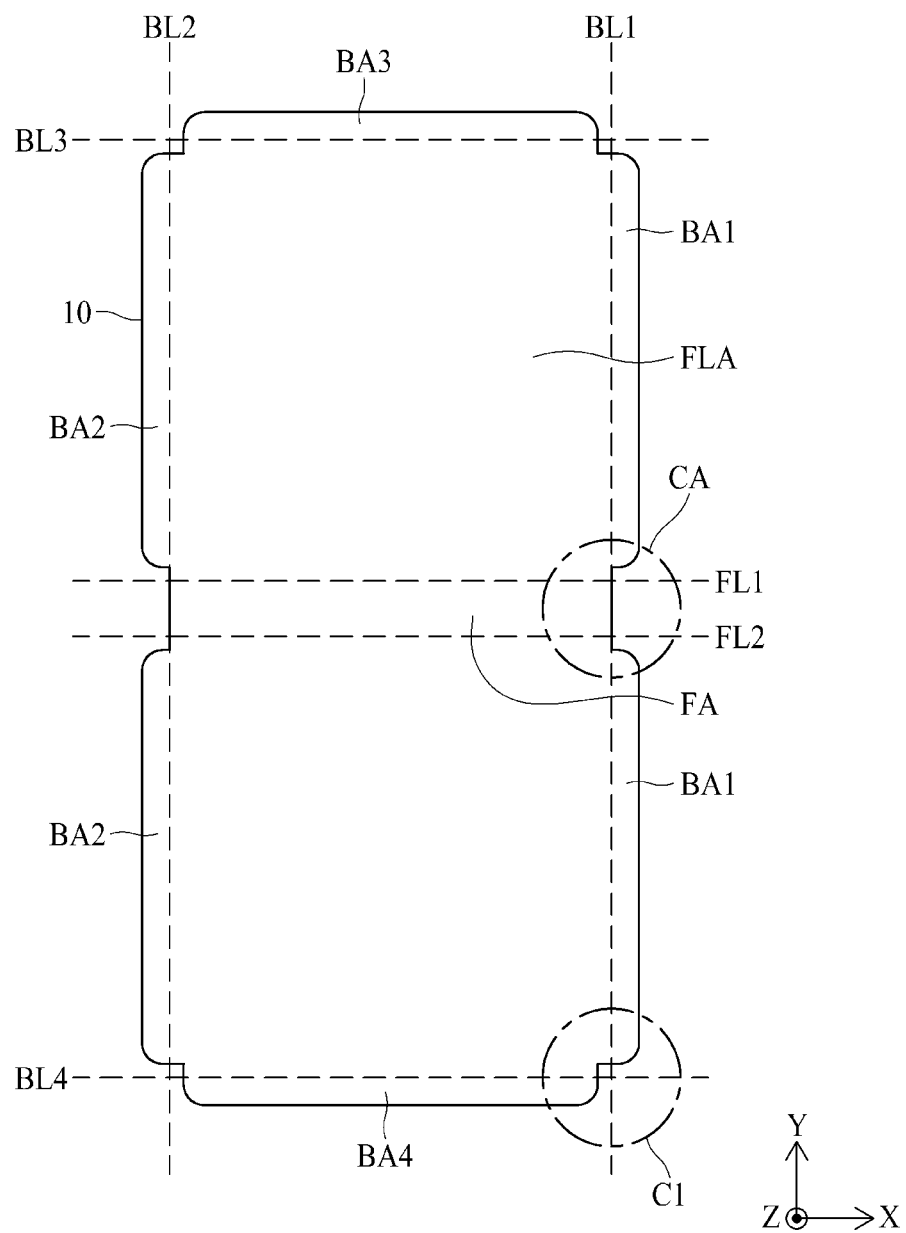
FIG. 4 is a plan view illustrating bending lines and folding lines of a flexible display apparatus according to an aspect of the present disclosure.

FIG. 4 is a plan view illustrating bending lines and folding lines of a flexible display apparatus FDIS according to an aspect of the present disclosure.

Referring to FIG. 4, the flexible display apparatus FDIS may include a flat part FLA, at least one bending parts (for example, first to fourth bending parts) BA1, BA2, BA3 and BA4 which are respectively bent along at least one bending lines (for example, first to fourth bending lines) BL1, BL2, BL3 and BL4, and a folding part FA which is folded along a plurality of folding lines (for example, first and second folding lines) FL1 and FL2. In FIG. 4, it is illustrated that the flexible display apparatus FDIS includes four bending parts BA1, BA2, BA3 and BA4 and one folding part FA, but aspects of the present disclosure are not limited thereto. That is, in aspects of the present disclosure, the number of bending parts and the number of folding parts are not limited to the aspect of FIG. 4.

The flat part FLA may be disposed in a center region of the flexible display apparatus FDIS. The flat part FLA may be an area which is flatly provided without being bent at a certain curvature.

The first bending part BA1 may be an area where the flexible display apparatus FDIS is bent with respect to the first bending line BL1. The first bending part BA1 may be a first side edge of the flexible display apparatus FDIS, and for example, may be a right edge of the flexible display apparatus FDIS as in FIG. 4. The first bending part BA1 may be bent at a first curvature with having first directionality. The first bending part BA1 may be an area which extends from a first side of the flat part FLA.

The second bending part BA2 may be an area where the flexible display apparatus FDIS is bent with respect to the second bending line BL2. As in FIG. 4, the second bending line BL2 may be parallel to the first bending line BL1. The second bending part BA2 may be a second side edge of the flexible display apparatus FDIS, and for example, may be a left edge of the flexible display apparatus FDIS as in FIG. 4. The second bending part BA2 may be bent at a second curvature with having second directionality. The second bending part BA2 may be an area which extends from a second side of the flat part FLA.

The third bending part BA3 may be an area where the flexible display apparatus FDIS is bent with respect to the third bending line BL3. As in FIG. 4, the third bending line BL3 may intersect the first bending line BL1 and the second bending line BL2. The third bending part BA3 may be a third side edge of the flexible display apparatus FDIS, and for example, may be an upper edge of the flexible display apparatus FDIS as in FIG. 4. The third bending part BA3 may be bent at a third curvature with having third directionality. The third bending part BA3 may be an area which extends from a third side of the flat part FLA.

The fourth bending part BA4 may be an area where the flexible display apparatus FDIS is bent with respect to the fourth bending line BL4. As in FIG. 4, the fourth bending line BL4 may intersect the first bending line BL1 and the second bending line BL2. The fourth bending part BA4 may be a fourth side edge of the flexible display apparatus FDIS, and for example, may be a lower edge of the flexible display apparatus FDIS as in FIG. 4. The fourth bending part BA4 may be bent at a fourth curvature with having fourth directionality. The fourth bending part BA4 may be an area which extends from a fourth side of the flat part FLA.

The first curvature of the first bending part BA1, the second curvature of the second bending part BA2, the third curvature of the third bending part BA3, and the fourth curvature of the fourth bending part BA4 may differ. Alternatively, the first curvature of the first bending part BA1 and the second curvature of the second bending part BA2 may be the same, and the third curvature of the third bending part BA3 and the fourth curvature of the fourth bending part BA4 may be the same. Alternatively, the first curvature of the first bending part BA1 and the third curvature of the third bending part BA3 may be the same, and the second curvature of the second bending part BA2 and the fourth curvature of the fourth bending part BA4 may be the same.

The folding part FA may be an area defined by the first folding line FL1, the second folding line FL2, the first bending line BL1, and the second bending line BL2. The flexible display apparatus FDIS may be folded with respect to each of the first folding line FL1 and the second folding line FL2. Therefore, the flexible display apparatus FDIS may be folded in an inward direction as in FIG. 3A or in an outward direction as in FIG. 3B, with respect to the folding lines. The first folding line FL1 and the second folding line FL2 may intersect the first bending line BL1 and the second bending line BL2. The folding part FA may be included in the flat part FLA.

FIGS. 5A to 5D are enlarged plan views illustrating in detail an example of a corner C1 of the flexible display apparatus of FIG. 4. In FIGS. 5A to 5D, enlarged views of a lower right corner of the flexible display apparatus of FIG. 4 are illustrated.

Figure 5A:
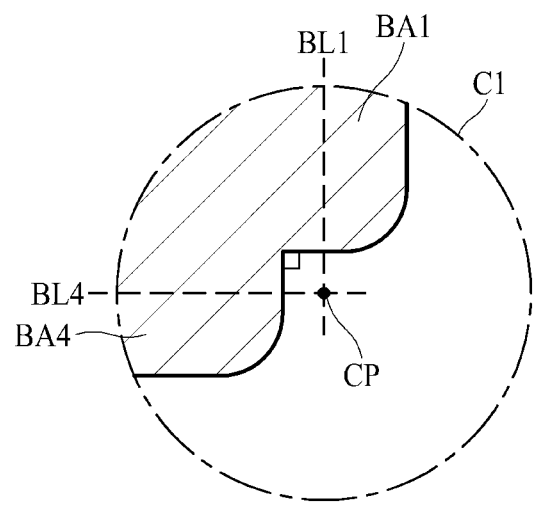
FIGS. 5A to 5D are enlarged plan views illustrating in detail an example of a corner of the flexible display apparatus of FIG. 4.
Figure 5B:
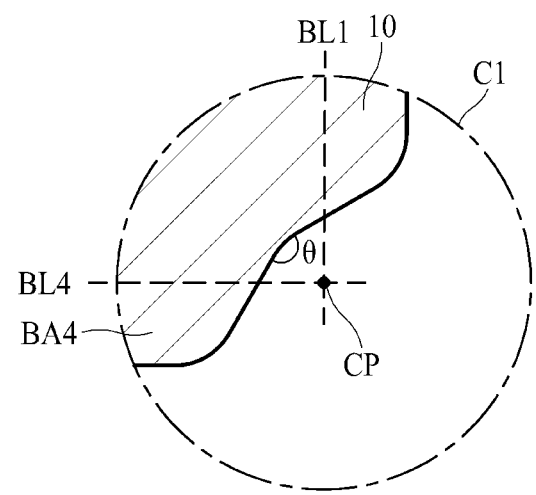
Figure 5C:
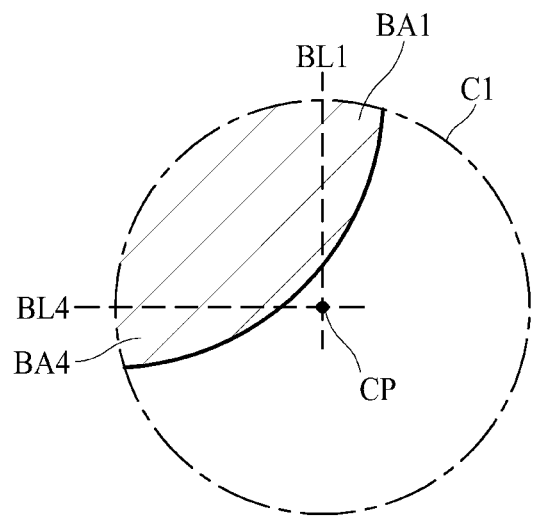

Referring to FIGS. 5A to 5C, a cross point of the first bending line BL1 and the fourth bending line BL4 may be disposed more outward than an edge of the corner C1. Therefore, the first bending part BA1 may not overlap the fourth bending part BA4.

Figure 5D:
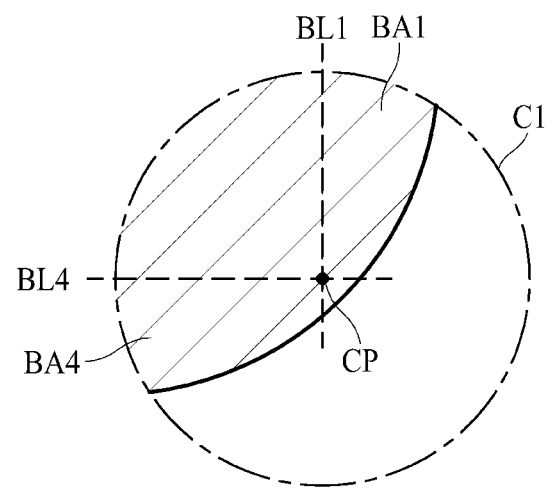

In detail, the first bending part BA1 may be bent at the first curvature in a first direction, and the fourth bending part BA4 may be bent at the fourth curvature in a fourth direction. Therefore, when the first bending part BA1 overlaps the fourth bending part BA4 as can be seen in FIG. 5D, a crack occurs in an overlapping region of the first bending part BA1 and the fourth bending part BA4. However, in aspects of the present disclosure, the corner C1 may be provided so that a cross point CP of the first bending line BL1 and the fourth bending line BL4 is disposed more outward than an edge of a corner between the first bending part BA1 and the fourth bending part BA4, and thus, the first bending part BA1 may not overlap the fourth bending part BA4. Accordingly, in aspects of the present disclosure, since the first bending part BA1 does not overlap the fourth bending part BA4, a crack caused by an overlap of the bending parts BA1 and BA4 does not occur.

The corner C1 of the flexible display apparatus may be provided so that an angle between the first bending part BA and the fourth bending part BA4 is 90 degrees as in FIG. 5A, or is an obtuse angle as in FIG. 5B. Alternatively, as in FIG. 5C, the corner C1 of the flexible display apparatus may be smoothly provided to have a circular or elliptical curvature. A planar shape of the corner C1 of the flexible display apparatus is not limited to a shape illustrated in FIGS. 5A to 5C.

Another corner of the flexible display apparatus, as in FIGS. 5A to 5C, may be provided so that a cross point of bending lines is disposed more outward than an edge of the other corner in order for bending parts not to overlap. Therefore, four side edges of the flexible display apparatus may all be bent. For example, a cross point of the first bending line BL1 and the third bending line BL3 may be disposed more outward than an edge of a corner between the first bending part BA1 and the third bending part BA3, and thus, the first bending part BA1 may not overlap the third bending part BA3. Also, a cross point of the second bending line BL2 and the third bending line BL3 may be disposed more outward than an edge of a corner between the second bending part BA2 and the third bending part BA3, and thus, the second bending part BA2 may not overlap the third bending part BA3. Also, a cross point of the second bending line BL2 and the fourth bending line BL4 may be disposed more outward than an edge of a corner between the second bending part BA2 and the fourth bending part BA4, and thus, the second bending part BA2 may not overlap the fourth bending part BA4.

As described above, according to the aspects of the present disclosure, the folding part FA defined by the folding lines may not overlap a bending part (or a bending area) bent by a bending line intersecting the folding lines. As a result, according to the aspects of the present disclosure, even when the flexible display apparatus is folded at the folding part FA, a crack is prevented from occurring in the bending area bent by the bending line intersecting the folding lines.

Moreover, according to the aspects of the present disclosure, a cross point of a bending line provided in the first direction and a bending line provided in the second direction intersecting the first direction may be disposed more outward than a corner between a bending area bent with respect to the bending line provided in the first direction and a bending area bent with respect to the bending line provided in the second direction. As a result, according to the aspects of the present disclosure, the bending area bent with respect to the bending line provided in the first direction may not overlap the bending area bent with respect to the bending line provided in the second direction. Therefore, according to the aspects of the present disclosure, since the bending area bent with respect to the bending line provided in the first direction does not overlap the bending area bent with respect to the bending line provided in the second direction, a crack caused by an overlap of the bending areas does not occur.

Figure 6:
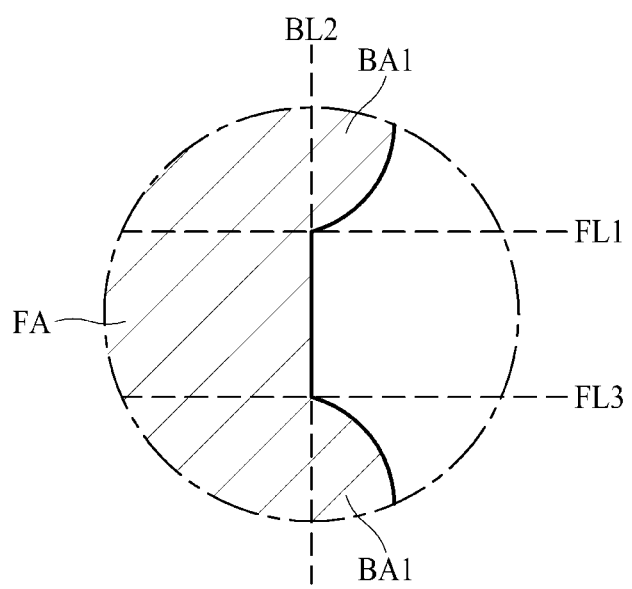
FIG. 6 is an enlarged plan view illustrating in detail a concave portion of FIG. 4.

FIG. 6 is an enlarged plan view illustrating in detail the concave portion of FIG. 4. In FIG. 6, a concave portion CA provided based on a non-overlap of the first bending part BA1 and the folding part FA is illustrated.

Referring to FIG. 6, when the folding part FA overlaps the first bending part BA1, a crack occurs in an overlap region of the folding part FA and the first bending part BA1. Therefore, the folding part FA is designed not to overlap the first bending part BA1. Accordingly, as in FIGS. 4 and 6, one edge of the flexible display apparatus may include a concave portion CA which is provided in a concave shape.

A concave portion CA may be provided in the other edge of the flexible display apparatus, based on a non-overlap of the second bending part BA2 and the folding part FA. When the folding part FA overlaps the second bending part BA2, a crack occurs in an overlap region of the folding part FA and the second bending part BA2. Therefore, the folding part FA is designed not to overlap the second bending part BA2. Accordingly, as in FIGS. 4 and 6, the other edge of the flexible display apparatus may include the concave portion CA which is provided in a concave shape.

Figure 7:
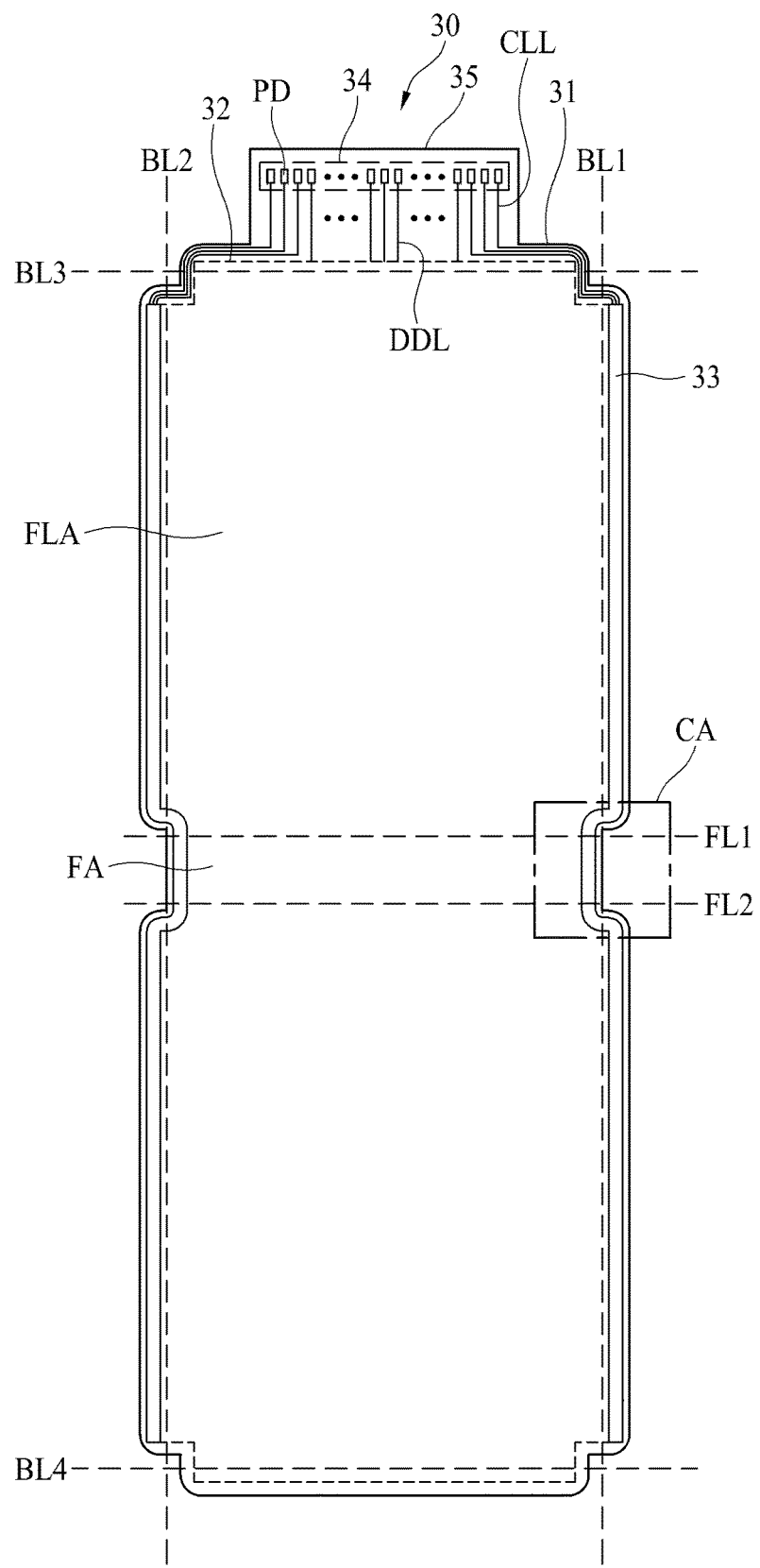
FIG. 7 is a plan view illustrating a scan driver and a display area of a display module of FIG. 2.

FIG. 7 is a plan view illustrating the scan driver and the display area of the display module 30 of FIG. 2.

In FIG. 7, for convenience of description, only a substrate 31, a display area 32, a scan driver 33, and a pad part 34 of a display module 30 are illustrated.

Referring to FIG. 7, a display module 30 may include a substrate 31, a display area 32 and a scan driver 33 disposed on the substrate 31, and a pad part 34 disposed on a protrusion 35 of the substrate 31.

Figure 10:
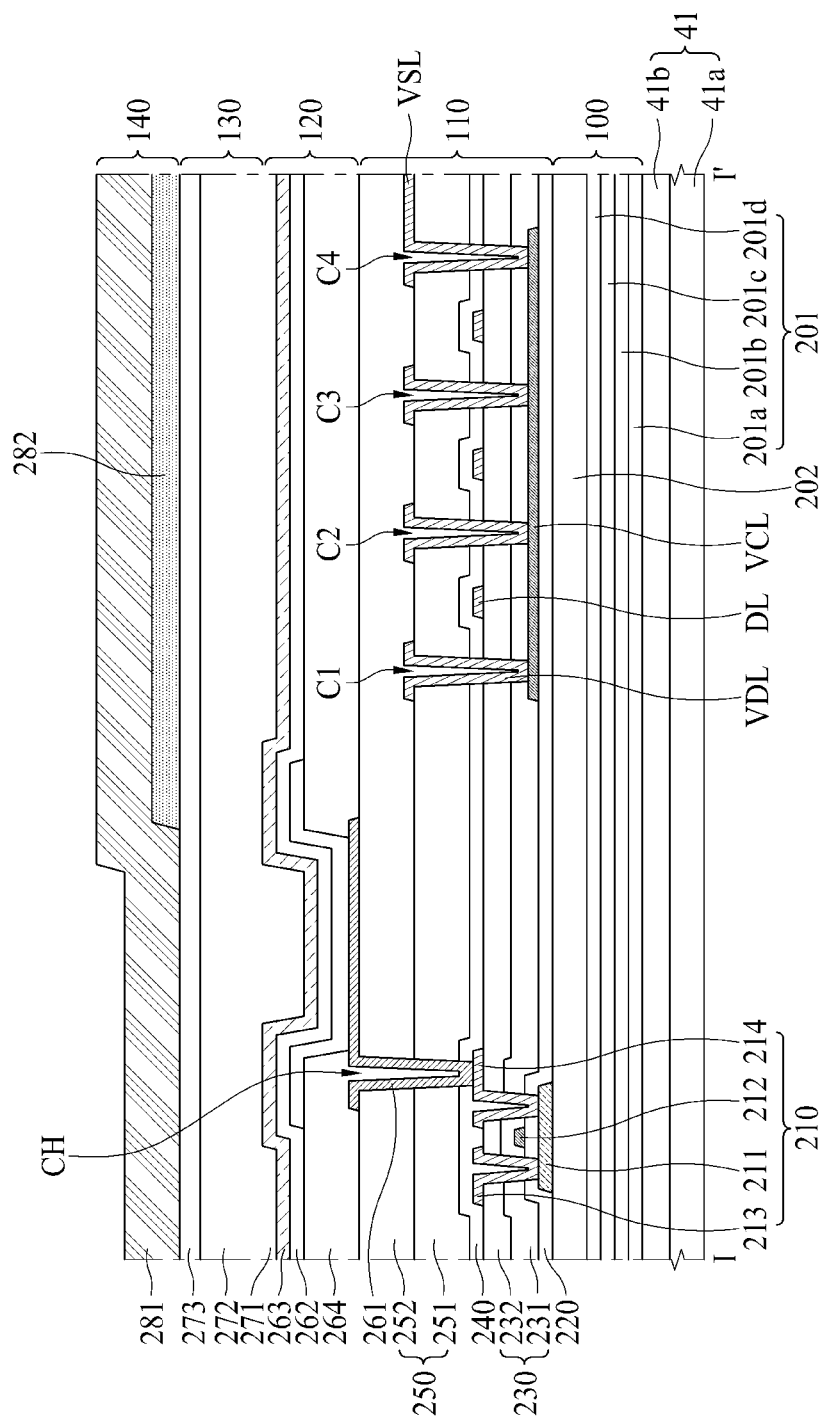
FIG. 10 is a cross-sectional view illustrating an example taken along line I-I' of FIG. 9.
Figure 11:
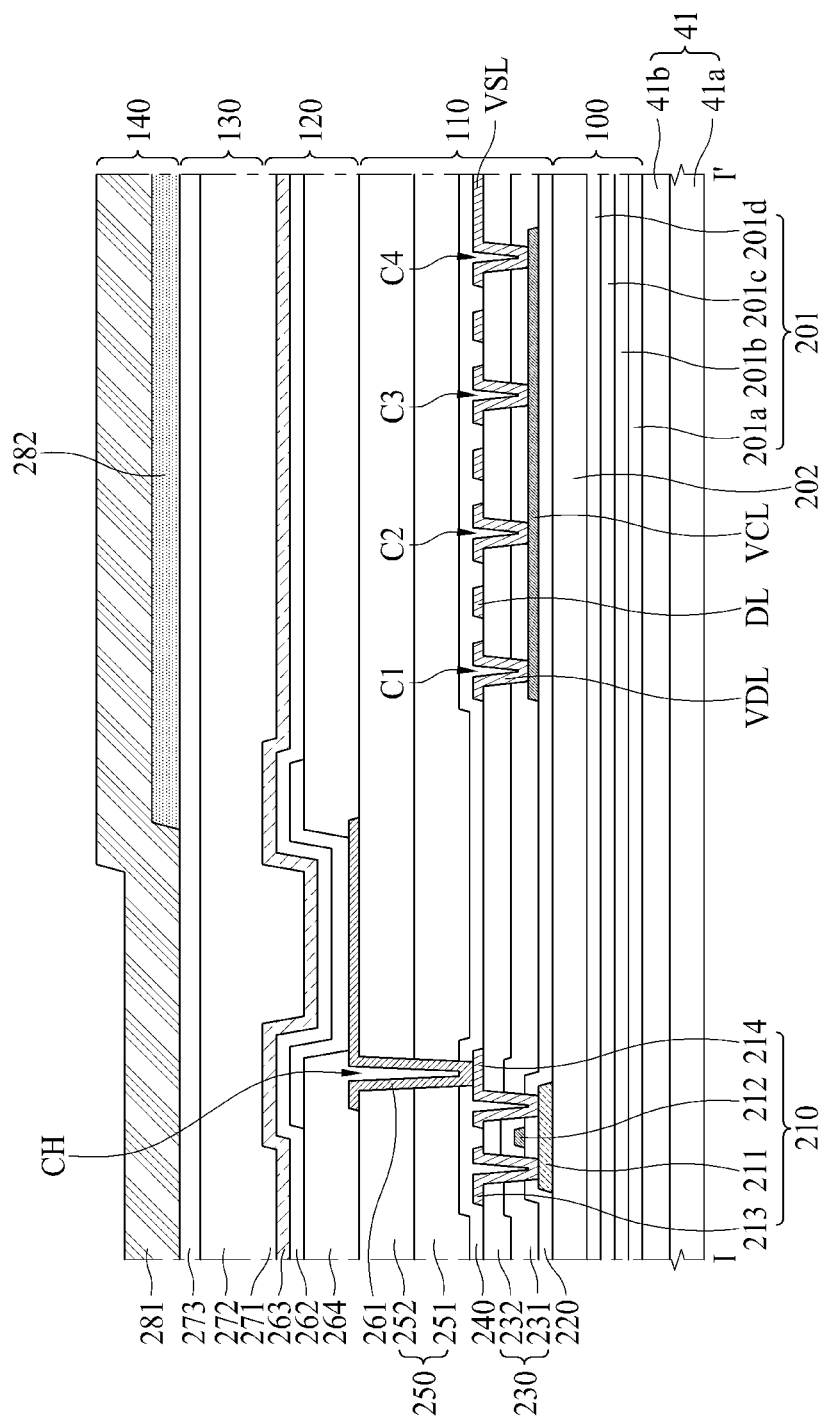
FIG. 11 is a cross-sectional view illustrating another example taken along line I-I' of FIG. 9.

The substrate 31, as in FIGS. 10 and 11, may include a supporting substrate and a flexible substrate. The supporting substrate may be a substrate for supporting the flexible substrate and may be formed of plastic. For example, the supporting substrate may be formed of polyethylene terephthalate (PET). The supporting substrate may not be provided in the protrusion 35.

The flexible substrate may be disposed on the supporting substrate and may be formed of a plastic film having flexibility. For example, the flexible substrate may be formed of a polyimide film.

A pixel array layer may be provided on the flexible substrate, and the display area 32 which displays an image and a scan driving circuit 33 and the pad part 34 provided in a non-display area except the display area 32 may be provided on the flexible substrate.

The display area 32 may be an area where a plurality of scan lines, a plurality of data lines, and a plurality of pixels are provided to display an image. The scan lines may be arranged in a first direction (an X-axis direction), and the data lines may be arranged in a second direction (a Y-axis direction) intersecting the first direction. The plurality of pixels may be respectively provided in a plurality of areas defined by intersections of the scan lines and the data lines. The display area 32 may be disposed in a flat part FLA, a first bending part BA1, a second bending part BA2, a third bending part BA3, and a fourth bending part BA4. Since the display area 32 is disposed in the first bending part BA1, the second bending part BA2, the third bending part BA3, and the fourth bending part BA4 as well as the flat part FLA, an image may also be displayed on the first bending part BA1, the second bending part BA2, the third bending part BA3, and the fourth bending part BA4.

The scan driving circuit 33 may receive a scan control signal from the integration driving circuit 70, generate scan signals according to the scan control signal, and sequentially supply the scan signals to the scan lines. Therefore, data voltages may be supplied to pixels connected to a scan line through which the scan signal is supplied.

The scan driving circuit 33, as in FIG. 7, may be disposed in each of both edges (for example, a left edge and a right edge) of the substrate 31, but aspects of the present disclosure are not limited thereto. For example, in aspects of the present disclosure, the scan driving circuit 33 may be disposed outside only at one side of the display area 32. The scan driving circuit 33, as in FIG. 7, may be disposed outside one side or both sides of the display area 32.

The scan driver 33 may be disposed in the flat part FLA, the first bending part BA1, and the second bending part BA2. The first bending part BA1 and the second bending part BA2 may not overlap the folding part FA, and thus, the scan driver 33 may be disposed in the flat part FLA in only a concave portion CA. The concave portion CA may denote an area which is provided in a concave shape in one edge of a flexible display apparatus, based on a non-overlap of a folding part FA and the first bending part BA1 or the second bending part BA2. The concave portion CA will be described below in detail with reference to FIG. 8.

The pad part 34 may be an area where a plurality of pads PD is provided. The pad part 34 may be disposed on the protrusion 35 protruding from the third bending part BA3. The flexible film 60 may be attached on the pads PD of the pad part 34 by using an anisotropy conductive film. Therefore, data voltages, source voltages, and the scan control signal output from the integration driving circuit 70 may be supplied to the pad part 34. The pads PD may be connected to, through a plurality of data link lines DLL, the data lines provided in the display area 32, or may be connected to the scan driver 33 through a plurality of control link lines CLL. Alternatively, the pads PD may be connected to, through a plurality of voltage link lines, a plurality of power supply lines for supplying source voltages to the pixels. Accordingly, the data voltages of the integration driving circuit 70 may be supplied to the data lines provided in the display area 32, the scan control signal may be supplied to the scan driver 33, and the source voltages may be supplied to the power supply lines.

Figure 8:
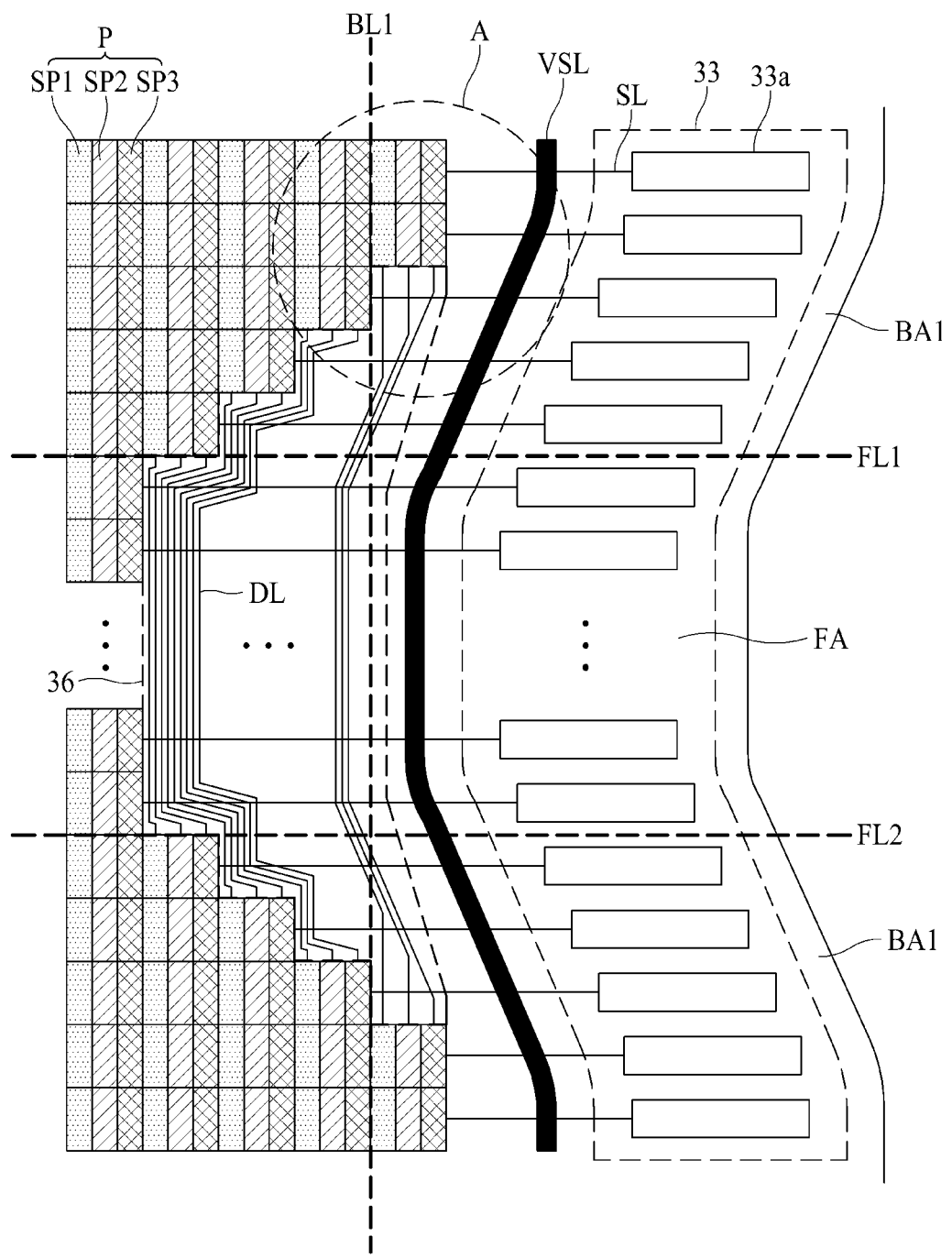
FIG. 8 is an enlarged plan view illustrating in detail an example of a concave portion of FIG. 7.

FIG. 8 is an enlarged plan view illustrating in detail an example of the concave portion CA of FIG. 7. In FIG. 8, a plurality of pixels P provided in the display area 32, a plurality of stages 33a included in the scan driver 33, and a first source voltage supply line VSL are illustrated in detail in the concave portion CA.

Referring to FIG. 8, the pixels P may be provided in the flat part FLA and the first bending part BA1. In FIG. 8, each of the pixels P is illustrated as including first to third subpixels SP1, SP2 and SP3, but aspects of the present disclosure are not limited to the number of subpixels. In other aspects, four or more subpixels may be provided.

The scan driver 33 may include the plurality of stages 33a. Each of the plurality of stages 33a may be connected to a corresponding scan line SL and may output a scan signal to the corresponding scan line SL.

The folding part FA may not overlap the first bending part BA1, and thus, the flexible display apparatus may include the concave portion CA where one edge is recessed in an inward direction. The scan driver 33 may be disposed in the flat part FLA in only the concave portion CA. Since the scan driver 33 is disposed in the flat part FLA, some of the pixels P provided in the display area 32 may be removed from the concave portion CA, for securing a disposition area of the scan driver 33. That is, a non-display area 36 where the pixels P are not provided may be provided in the concave portion CA.

In detail, as in FIG. 8, the pixels P provided in the display area 32 may be removed along a shape of the concave portion CA, and thus, may be arranged in a stair form. For example, the number of pixels P provided in an edge of the display area 32 may be reduced in a direction from an upper side to a center of the concave portion CA and may increase in a direction from the center to a lower side of the concave portion CA.

By removing pixels P, the non-display area 36 where the removed pixels P are not provided may be provided, and only a plurality of scan lines SL and a plurality of data lines DL may be arranged in the non-display area 36. In order to minimize a size of the non-display area 36, the data lines DL may be arranged in a stair form in the non-display area 36. Also, in order to minimize a size of the non-display area 36, an interval between adjacent data lines of data lines DL in the non-display area 36 may be narrower than an interval between adjacent data lines of data lines DL in the display area 32.

The plurality of stages 33a of the scan driver 33, as in FIG. 8, may be arranged in a stair form along a shape of the concave portion CA.

The first source voltage supply line VSL may be disposed between the pixels P and the plurality of stages 33a of the scan driver 33. The first source voltage supply line VSL may be provided to have a stair form similar to a stair form where the data lines DL in the concave portion CA are arranged.

The first source voltage supply line VSL may be disposed in the flat part FLA, the first bending part BA1, and the second bending part BA2. The first source voltage supply line VSL may be disposed in the flat part FLA in only the concave portion CA.

Figure 9:
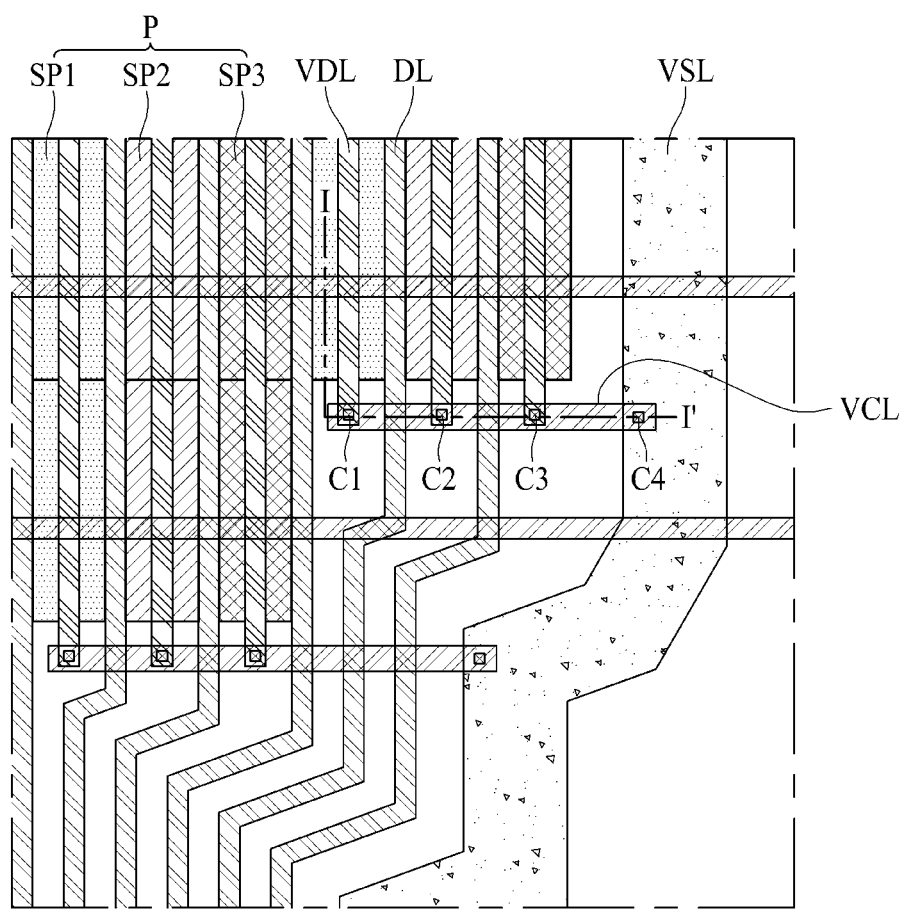
FIG. 9 is an enlarged plan view illustrating in detail an example of a region A of FIG. 8.

FIG. 9 is an enlarged plan view illustrating in detail an example of a region A of FIG. 8.

Referring to FIG. 9, a plurality of scan lines may be arranged in a first direction (an X-axis direction), and a plurality of data lines DL and a plurality of first source voltage lines VDL may be arranged in a second direction (a Y-axis direction) intersecting the first direction. A plurality of pixels P may each include first to third subpixels SP1, SP2 and SP3. The first to third subpixels SP1, SP2 and SP3 may be respectively provided in a plurality of areas defined by intersections of the scan lines SL and the data lines DL.

The first source voltage lines VDL, as in FIG. 9, may be connected to the first source voltage supply line VSL through a plurality of voltage connection lines VCL in the non-display area 36. Therefore, the data lines DL may be arranged to cross the non-display area 36, but the first source voltage lines VDL may be arranged not to cross the non-display area 36. Therefore, the first source voltage lines VDL may be removed from the non-display area 36, and thus, a size of the non-display area 36 is minimized.

FIG. 10 is a cross-sectional view illustrating an example taken along line I-I' of FIG. 9. Hereinafter, a cross-sectional structure of the third subpixel SP3 and the voltage connection line VCL will be described in detail with reference to FIG. 10.

Referring to FIG. 10, a substrate 41 may include a supporting substrate 41a and a flexible substrate 41b. The supporting substrate 41a may be a substrate for supporting the flexible substrate 41b and may be formed of plastic. For example, the supporting substrate 41a may be formed of PET. The flexible substrate 41b may be disposed on the supporting substrate 41a and may be formed of a plastic film having flexibility. For example, the flexible substrate 41b may be formed of a polyimide (PI) film.

A buffer layer 100 may be provided on the substrate 41. The buffer layer 100 protects a plurality of thin film transistors (TFTs) 210 and a plurality of light emitting elements from water ($H_2O$) or oxygen ($O_2$) which penetrates into the inside through the substrate 41 vulnerable to penetration of water. The buffer layer 100 may include a multi buffer layer 201 and an active buffer layer 202.

The multi buffer layer 201 may include a plurality of buffer layers (for example, first to fourth buffer layers) 201a, 201b, 201c and 201d which are alternately stacked. For example, the first and third buffer layers 201a and 201c of the multi buffer layer 201 may each be formed of silicon oxide (SiOx), and the second and fourth buffer layers 201b and 201d may each be formed of silicon nitride (SiNx).

The active buffer layer 202 may be disposed on the multi buffer layer 201. The active buffer layer 202 may be formed of silicon oxide (SiOx).

A TFT layer 110 may be provided on the buffer layer 100. The TFTs 210, a plurality of scan lines, a plurality of data lines, a plurality of initialization voltage lines, and a plurality of first source voltage lines may be provided in the TFT layer 110.

The TFTs 210 may each include an active layer 211, a gate electrode 212, a source electrode 213, and a drain electrode 214. In FIG. 10, the TFTs 210 are exemplarily illustrated as being formed as a top gate type where the gate electrode 212 is disposed on the active layer 211, but aspects of the present disclosure are not limited thereto. In other aspects, the TFTs 210 may be formed as a bottom gate type where the gate electrode 212 is disposed under the active layer 211 or a double gate type where the gate electrode 212 is disposed both on and under the active layer 211.

The active layer 211 may be provided on the buffer layer 100. The active layer 211 may be formed of a silicon-based semiconductor material, an oxide-based semiconductor material, and/or the like. The silicon-based semiconductor material may use amorphous silicon or polycrystalline silicon which has mobility better than amorphous silicon, is low in consumption power, and is good in reliability.

Examples of the oxide-based semiconductor material may include an InSnGaZnO-based material which is four-element metal oxide, an InGaZnO-based material, an InSnZnO-based material, an InAlZnO-based material, a SnGaZnO-based material, an AlGaZnO-based material, and a SnAlZnO-based material which are three-element metal oxide, and an InZnO-based material, SnZnO-based material, AlZnO-based material, ZnMgO-based material, SnMgO-based material, InMgO-based material, InGaO-based material which are two-element metal oxide, InO-based material, SnO-based material, and ZnO-based material, and a composition ratio of elements is not limited.

The active layer 211 may include a source region and a drain region each including p-type or n-type impurities, and a channel formed between the source region and the drain region, and may include a low concentration doping region between the source region and the channel and/or between the drain region and the channel, which is adjacent to the channel.

A light blocking layer for blocking external light incident on the active layer 211 may be provided between the buffer layer 100 and the active layer 211.

A gate insulation layer 220 may be provided on the active layer 211. The gate insulation layer 220 may be formed of an inorganic layer, and for example, may be formed of SiOx, SiNx, or a multilayer thereof.

The gate electrode 212, the scan lines, and the voltage connection lines VCL may be provided on the gate insulation layer 220. The gate electrode 212, the scan lines, and the voltage connection lines VCL may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be provided on the gate electrode 212, the scan lines, and the voltage connection lines VCL. The interlayer insulation layer 230 may include a first interlayer insulation layer 231 and a second interlayer insulation layer 232. The first interlayer insulation layer 231 may be formed of SiOx, and the second interlayer insulation layer 232 may be formed of SiNx.

The source electrode 213, the drain electrode 214, and the data lines DL may be provided on the interlayer insulation layer 230. Each of the source electrode 213 and the drain electrode 214 may be connected to the active layer 211 through a contact hole which passes through the gate insulation layer 220 and the interlayer insulation layer 230. The source electrode 213, the drain electrode 214, and the data lines DL may each be formed of a single layer or a multilayer which includes one of Mo, Al, Cr, Au, Ti, Ni, Nd, and Cu, or an alloy thereof.

A passivation layer 240 for insulating the TFTs 210 may be provided on the source electrode 213, the drain electrode 214, and the data lines DL. The passivation layer 240 may be formed of SiNx.

A planarization layer 250 for planarizing a step height caused by the TFTs 210 may be provided on the passivation layer 240. The planarization layer 250 may include a first planarization layer 251 provided on the passivation layer 240 and a second planarization layer 252 provided on the first planarization layer 251. The first and second planarization layers 251 and 252 may each be formed of an organic layer such as acryl resin, epoxy resin, phenolic resin, polyamide resin, polyimide resin, or the like.

The first source voltage lines VDL may be provided on the first planarization layer 251. The first source voltage lines VDL may be connected to a voltage connection line VCL through a contact hole which passes through the interlayer insulation layer 230, the passivation layer 240 and the first planarization layer 251. The first source voltage lines VDL may each be formed of a single layer or a multilayer which includes one of Mo, Al, Cr, Au, Ti, Ni, Nd, and Cu, or an alloy thereof.

A light emitting element layer 120 may be provided on the TFT layer 110. The light emitting element layer 120 may include a plurality of light emitting elements and a bank 264. In FIG. 10, an example where the light emitting element layer 120 emits light in the top emission type is described, but aspects of the present disclosure are not limited thereto. In other aspects, the light emitting element layer 120 may emit light in the bottom emission type.

The light emitting elements and the bank 264 may be provided on the planarization layer 250. The light emitting element may each include a first electrode 261, a light emitting layer 262, and a second electrode 263. The first electrode 261 may be an anode electrode, and the second electrode 263 may be a cathode electrode.

The first electrode 261 may be provided on the planarization layer 250. The first electrode 261 may be connected to the source electrode 213 or the drain electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of silver (Ag), palladium (Pd), and copper (Cu).

The bank 264 may be provided on the planarization layer 250 to cover a portion of the first electrode 261. The bank 264 may be a pixel defining layer which defines a plurality of emission areas of subpixels. That is, the emission areas may each be an area where the first electrode 261, the light emitting layer 262, and the second electrode 263 are sequentially stacked, and a hole from the first electrode 261 and an electrode from the second electrode 263 are combined in the light emitting layer 262 to emit light. An area where the bank 264 is provided may be a non-emission area. The bank 264 may be formed of an organic layer such as acryl resin, epoxy resin, phenolic resin, polyamide resin, polyimide resin, or the like.

A spacer may be provided on the bank 264. The spacer may be formed of an organic layer such as acryl resin, epoxy resin, phenolic resin, polyamide resin, polyimide resin, or the like.

The light emitting layer 262 may be provided on the first electrode 261 and the bank 264. The light emitting layer 262 may include a hole transport layer (HTL), an organic light emitting layer, and an electron transport layer (ETL). The hole transport layer may smoothly transfer a hole, injected from the first electrode 261, to the organic light emitting layer. The organic light emitting layer may be formed of an organic material including a phosphorescent or fluorescent material. The electron transport layer may smoothly transfer an electron, injected from the second electrode 263, to the organic light emitting layer. The light emitting layer 262 may further include a hole injection layer (HIL), a hole blocking layer (HBL), an electron injection layer (EIL), and an electron blocking layer (EBL), in addition to the hole transport layer, the organic light emitting layer, and the electron transport layer.

Moreover, the light emitting layer 262 may be provided in a tandem structure of two or more stacks. Each of the stacks may include a hole transport layer, an organic light emitting layer, and an electron transport layer. If the light emitting layer 262 is provided in the tandem structure of two or more stacks, a charge generation layer may be provided between adjacent stacks. The charge generation layer may include an n-type charge generation layer, disposed adjacent to a lower stack, and a p-type charge generation layer which is provided on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer where an organic host material having an ability to transport electrons is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generation layer may be an organic layer where a dopant is doped on an organic host material having an ability to transport holes.

The light emitting layer 262 may be a common layer which is provided in the pixels in common, and in this case, may be a white light emitting layer that emits white light. However, aspects of the present disclosure are not limited thereto. In other aspects, the light emitting layer 262 may be provided in each of subpixels, and in this case, may be divided into a red light emitting layer which emits red light, a green light emitting layer which emits green light, and a blue light emitting layer which emits blue light.

The second electrode 263 may be provided on the light emitting layer 262. The second electrode 263 may be provided to cover the light emitting layer 262. The second electrode 263 may be a common layer which is provided in the pixels in common.

The second electrode 263 may be formed of a transparent conductive oxide (TCO), such as indium tin oxide (ITO) or indium zinc oxide (IZO) capable of transmitting light, or a semi-transmissive (or transflective) conductive material such as magnesium (Mg), silver (Ag), or an alloy of Mg and Ag. If the second electrode 263 is formed of a semi-transmissive conductive material, emission efficiency is enhanced by a micro-cavity. A capping layer may be formed on the second electrode 263.

An encapsulation layer 130 may be provided on the light emitting element layer 120. The encapsulation layer 130 prevents oxygen or water from penetrating into the light emitting layer 262 and the second electrode 263. To this end, the encapsulation layer 130 may include at least one inorganic layers (for example, first and second inorganic layers) 271 and 273. For example, each of the at least one inorganic layers 271 and 273 may be formed of one of silicon nitride, aluminum nitride, zirconium nitride, titanium nitride, hafnium nitride, tantalum nitride, silicon oxide, aluminum oxide, and titanium oxide.

The encapsulation layer 130 may include at least one organic layer 272 which is formed to have a sufficient thickness, for acting as a particle cover layer which prevents particles from penetrating into the light emitting layer 262 and the second electrode 263. The organic layer 272 may be formed of a transparent material for transmitting light emitted from the light emitting layer 262. The organic layer 272 may be formed of an organic material for transmitting 99% of the light emitted from the light emitting layer 262, and for example, may be formed of acryl resin, epoxy resin, phenolic resin, polyamide resin, polyimide resin, and/or the like, but is not limited thereto.

In FIG. 10, an example where the first inorganic layer 271 is provided on the second electrode 263, the organic layer 272 is provided on the first inorganic layer 271, and the second inorganic layer 273 is provided on the organic layer 272 is illustrated, but aspects of the present disclosure are not limited thereto.

Depending on the case, a color filter layer 140 may be provided on the encapsulation layer 130. The color filter layer 140 may include a plurality of color filters 281 and a black matrix 282. The color filters 281 may be respectively disposed in correspondence with emission parts of the subpixels. The black matrix 282 may be disposed between adjacent color filters 281, for preventing color mixture from occurring because light emitted from one pixel travels to the color filter 281 of an adjacent pixel. The black matrix 282 may be disposed in correspondence with the bank 264. An overcoat layer may be provided on the color filters 281, for planarizing a step height caused by the color filters 281 and the black matrix 282.

A barrier film may be disposed on the color filters 281. The barrier film may be a layer for protecting the light emitting device layer 120 from oxygen or water. The barrier film may include a touch sensing layer for sensing a user touch.

FIG. 11 is a cross-sectional view illustrating another example taken along line I-I' of FIG. 9.

Except for that a plurality of first source voltage lines VDL are provided on an interlayer insulation layer 230 instead of a first planarization layer 251, description on the aspect of FIG. 11 is substantially the same as description given above with reference to FIG. 10. Hereinafter, therefore, for convenience of description, the first source voltage lines VDL will be mainly described with reference to FIG. 11, and description overlapping FIG. 10 is omitted.

Referring to FIG. 11, a plurality of first source voltage lines VDL may be provided on an interlayer insulation layer 230 along with a source electrode 213, a drain electrode 214, and a plurality of data lines DL. The first source voltage line VDL may be connected to a voltage connection line VCL through a contact hole passing through the interlayer insulation layer 230. The source electrode 213, the drain electrode 214, the data lines DL, and the first source voltage lines VDL may each be formed of a single layer or a multilayer which includes one of Mo, Al, Cr, Au, Ti, Ni, Nd, and Cu, or an alloy thereof.

Figure 12:
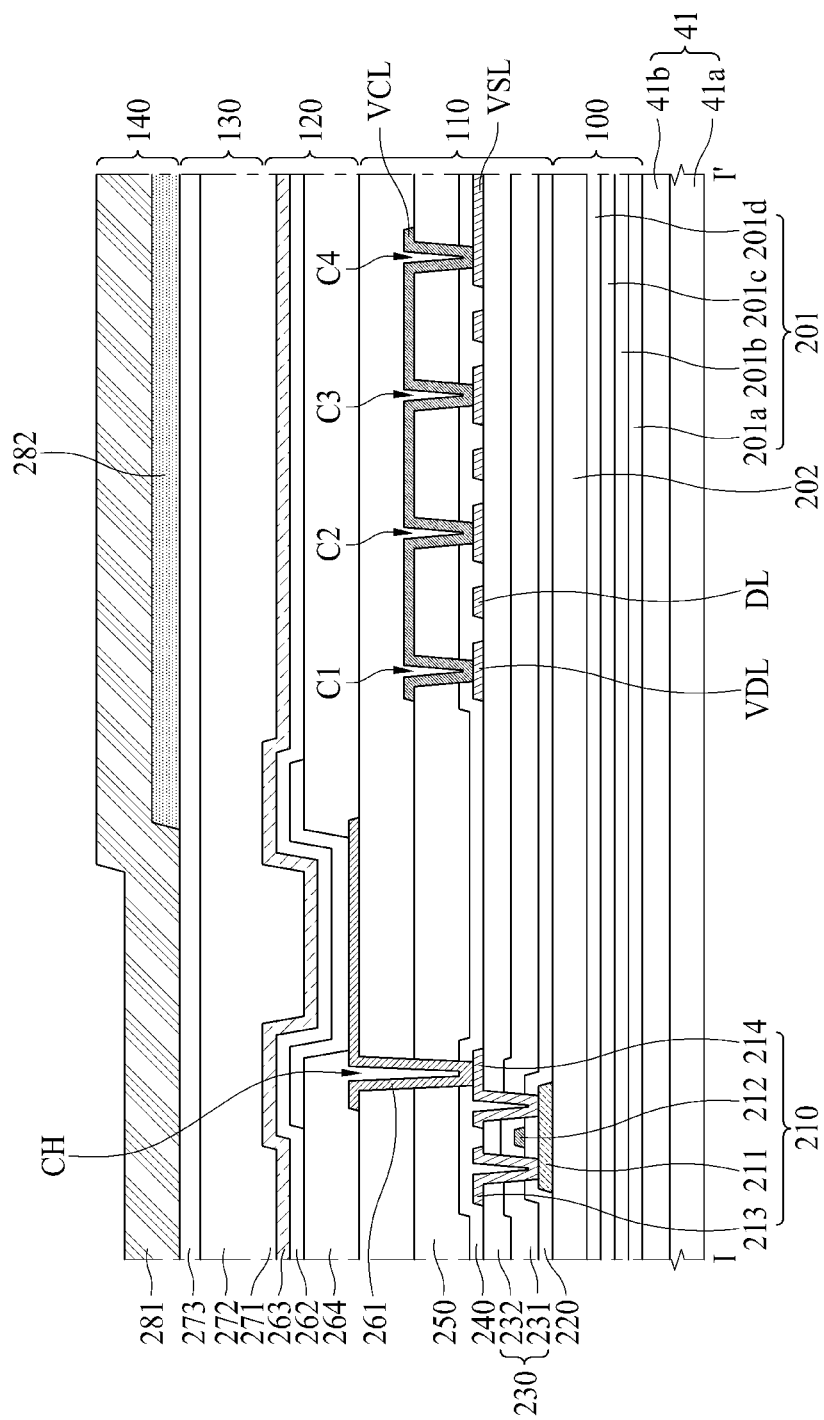
FIG. 12 is a cross-sectional view illustrating another example taken along line I-I' of FIG. 9.

FIG. 12 is a cross-sectional view illustrating another example taken along line I-I' of FIG. 9.

Except for that a plurality of first source voltage lines VDL are provided on an interlayer insulation layer 230 instead of a first planarization layer 251 and a plurality of voltage connection lines VCL are provided on the first planarization layer 251 instead of a gate insulation layer 220, description on the aspect of FIG. 12 is substantially the same as description given above with reference to FIG. 10. Hereinafter, therefore, for convenience of description, the first source voltage lines VDL and the voltage connection lines VCL will be mainly described with reference to FIG. 12, and description overlapping FIG. 10 is omitted.

Referring to FIG. 12, a plurality of first source voltage lines VDL may be provided on an interlayer insulation layer 230 along with a source electrode 213, a drain electrode 214, and a plurality of data lines DL. Each of the first source voltage lines VDL may be connected to a corresponding voltage connection line VCL through a contact hole passing through the interlayer insulation layer 230. The source electrode 213, the drain electrode 214, the data lines DL, and the first source voltage lines VDL may each be formed of a single layer or a multilayer which includes one of Mo, Al, Cr, Au, Ti, Ni, Nd, and Cu, or an alloy thereof.

A plurality of voltage connection lines VCL may be provided on a first planarization layer 251. Each of the voltage connection lines VCL may be connected to a corresponding first source voltage line VDL through a contact hole passing through the first planarization layer 251. The voltage connection lines VCL may each be formed of a single layer or a multilayer which includes one of Mo, Al, Cr, Au, Ti, Ni, Nd, and Cu, or an alloy thereof.

Figure 13:
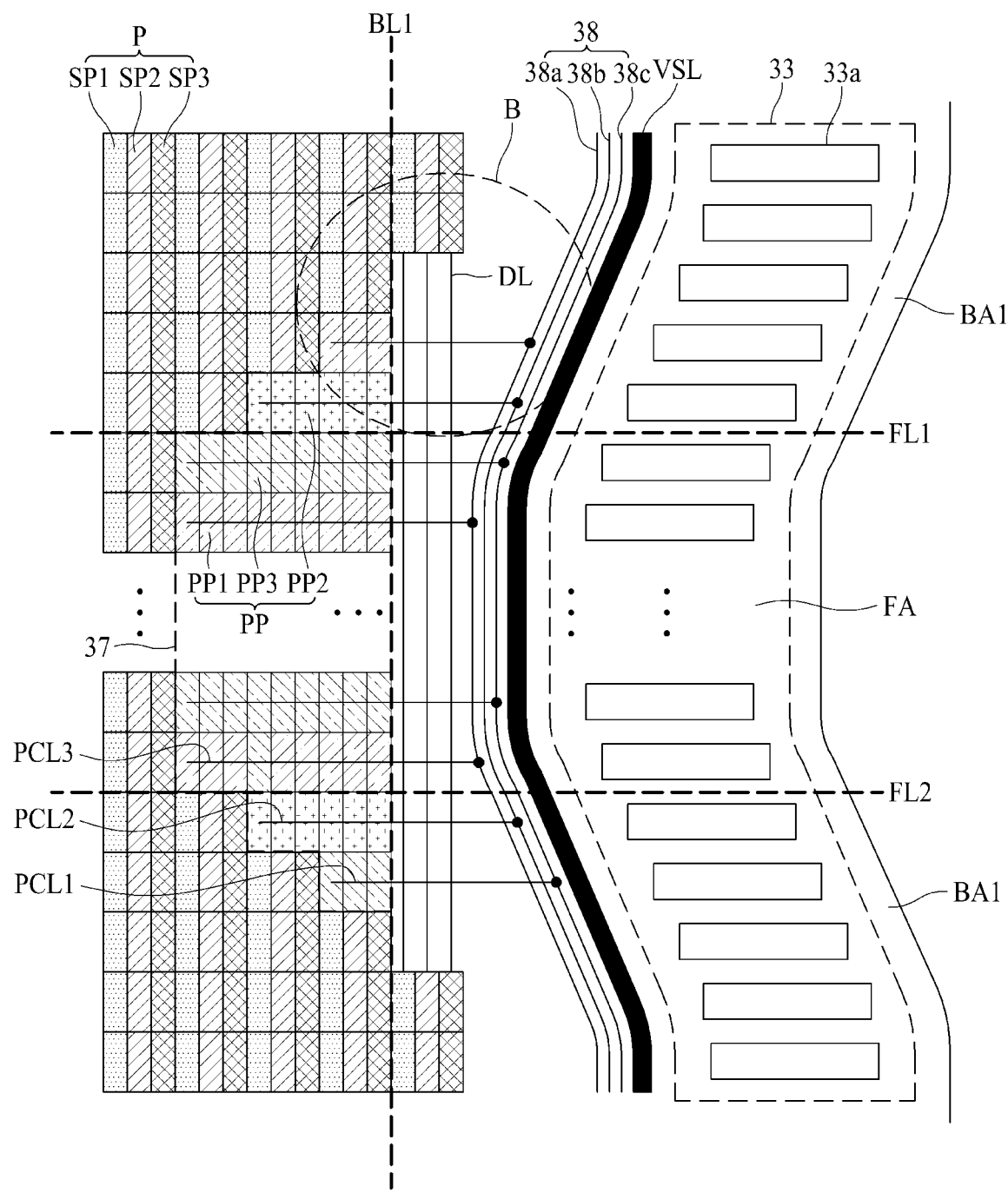
FIG. 13 is an enlarged plan view illustrating in detail another example of the concave portion of FIG. 7.

FIG. 13 is an enlarged plan view illustrating in detail another example of the concave portion of FIG. 7.

Except for that a passive pixel part 37 including a plurality of passive pixels is provided instead of a non-display area 36 and a plurality of passive data lines 38 are provided between the passive pixel part 37 and a first source voltage supply line VSL, description on the aspect of FIG. 13 is substantially the same as description given above with reference to FIG. 8. Hereinafter, therefore, for convenience of description, the passive pixel part 37 and the passive data lines 38 will be mainly described with reference to FIG. 13, and description overlapping FIG. 8 is omitted.

Referring to FIG. 13, a plurality of passive pixels PP included in a passive pixel part 37 may not be connected to a plurality of data lines DL and may be connected to a plurality of passive data lines 38 instead of the data lines DL.

The passive pixels PP, as in FIG. 13, may include a first passive pixel PP1 which emits the same light as light emitted from a first subpixel SP1, a second passive pixel PP2 which emits the same light as light emitted from a second subpixel SP2, and a third passive pixel PP3 which emits the same light as light emitted from a third subpixel SP3. Pixels arranged in one row may be passive pixels which emit lights having the same color. Also, the first to third passive pixels PP1, PP2 and PP3 may be alternately arranged by units of rows. For example, when a plurality of first passive pixels PP1 are arranged in a kth (where k is a positive integer) row of the passive pixel part 37, a plurality of second passive pixels PP2 may be arranged in a k+1st row, a plurality of third passive pixels PP3 may be arranged in a k+2nd row, and the plurality of first passive pixels PP1 may be arranged in a k+3rd row.

The passive data lines 38 may be disposed between the passive pixel part 37 and a first source voltage supply line VSL. The passive data lines 38 may include a first passive data line 38a for supplying first passive data voltages to the first passive pixels PP1, a second passive data line 38b for supplying second passive data voltages to the second passive pixels PP2, and a third passive data line 38c for supplying third passive data voltages to the third passive pixels PP3.

The passive data lines 38 may be connected to, through the pads PAD, the integration driving circuit 70 disposed on the flexible film 60. Therefore, the passive data lines 38 in the display area 32 may be supplied with passive data voltages from the integration driving circuit 70. In detail, the integration driving circuit 70 may analyze digital video data, which are to be supplied to the passive pixels PP, of pieces of digital video data input from the outside to generate passive data voltages. For example, the integration driving circuit 70 may calculate a red representative value, such as an average value or an intermediate value, of red digital video data of the digital video data which are to be supplied to the passive pixels PP, may generate a first passive data voltage, based on the calculated red representative value, and may supply the first passive data voltage to the first passive pixels PP1. Also, the integration driving circuit 70 may calculate a green representative value, such as an average value or an intermediate value, of green digital video data of the digital video data which are to be supplied to the passive pixels PP, may generate a second passive data voltage, based on the calculated green representative value, and may supply the second passive data voltage to the second passive pixels PP2. Also, the integration driving circuit 70 may calculate a blue representative value, such as an average value or an intermediate value, of blue digital video data of the digital video data which are to be supplied to the passive pixels PP, may generate a third passive data voltage, based on the calculated blue representative value, and may supply the third passive data voltage to the third passive pixels PP3.

The first passive pixels PP1 may be connected to the first passive data line 38a through a first passive connection line PCL1. The second passive pixels PP2 may be connected to the second passive data line 38b through a second passive connection line PCL2. The third passive pixels PP3 may be connected to the third passive data line 38c through a third passive connection line PCL3.

In FIG. 13, an example where the passive pixels PP of the passive pixel part 37 are arranged in only the flat part FLA is illustrated, but aspects of the present disclosure are not limited thereto. In other aspects, the passive pixels PP of the passive pixel part 37 may also be arranged in the first bending part BA1.

Moreover, the first passive data lines 38 may be disposed in the flat part FLA, the first bending part BA1, and the second bending part BA2. The first passive data lines 38 may be disposed in the flat part FLA in only the concave portion CA.

Figure 14:
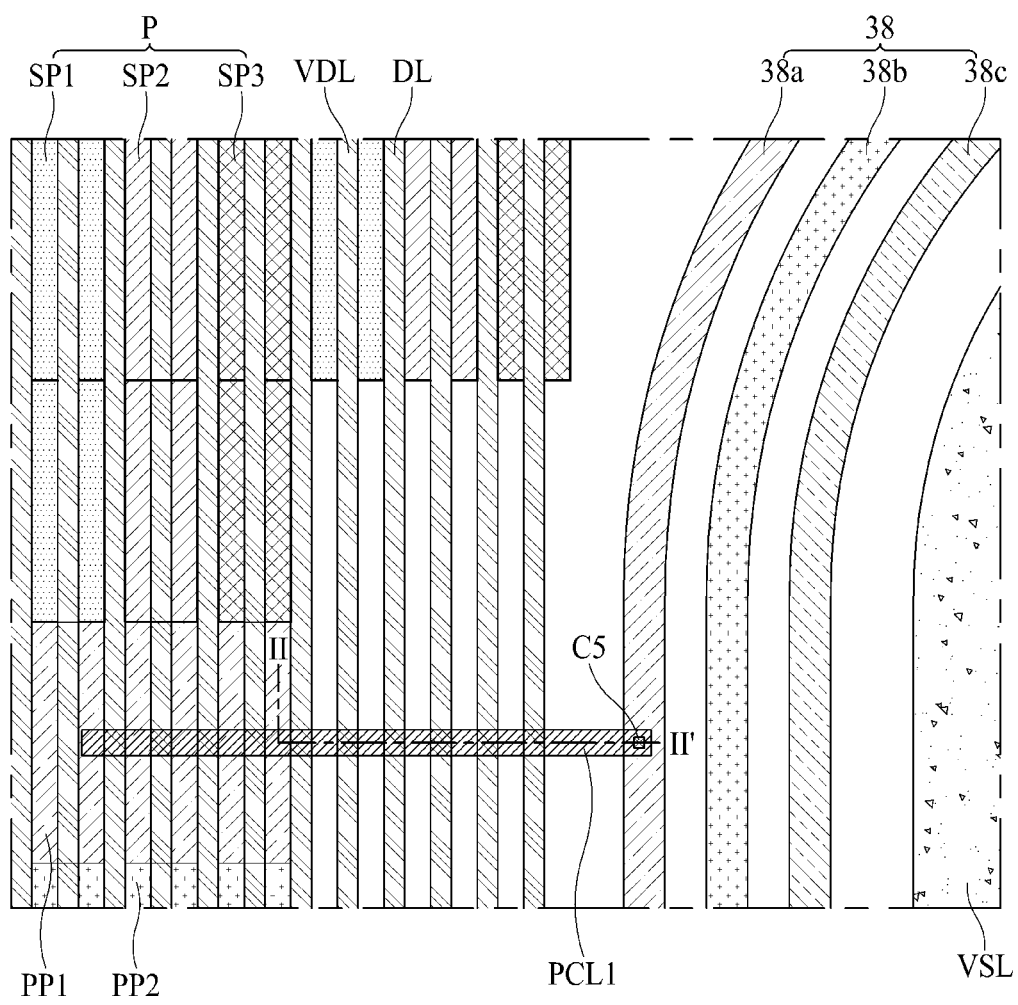
FIG. 14 is an enlarged plan view illustrating in detail an example of a region B of FIG. 13.

FIG. 14 is an enlarged plan view illustrating in detail an example of a region B of FIG. 13.

Referring to FIG. 14, a plurality of scan lines may be arranged in a first direction (an X-axis direction), and a plurality of data lines DL and a plurality of first source voltage lines VDL may be arranged in a second direction (a Y-axis direction) intersecting the first direction. A plurality of pixels P may each include first to third subpixels SP1, SP2 and SP3. A plurality of passive pixels PP may include first to third passive pixels PP1, PP2 and PP3. The first to third subpixels SP1, SP2 and SP3 and the first to third passive pixels PP1, PP2 and PP3 may be respectively provided in a plurality of areas defined by intersections of the scan lines and the data lines DL. The data lines DL and the first source voltage lines VDL may be arranged to cross the passive pixel part 37.

The first passive pixels PP1 may be connected to a first passive data line 38a through a first passive connection line PCL1. First passive pixels PP1 arranged in one row may be connected to the first passive connection line PCL1 in common, and thus, the first passive connection line PCL1 may be arranged to cross first passive pixels PP1 arranged in one row.

The second passive pixels PP2 may be connected to a second passive data line 38b through a second passive connection line PCL2. Second passive pixels PP2 arranged in one row may be connected to the second passive connection line PCL2 in common, and thus, the second passive connection line PCL2 may be arranged to cross second passive pixels PP2 arranged in one row.

The third passive pixels PP3 may be connected to a third passive data line 38c through a third passive connection line PCL3. Third passive pixels PP3 arranged in one row may be connected to the third passive connection line PCL3 in common, and thus, the third passive connection line PCL3 may be arranged to cross third passive pixels PP3 arranged in one row.

Figure 15:
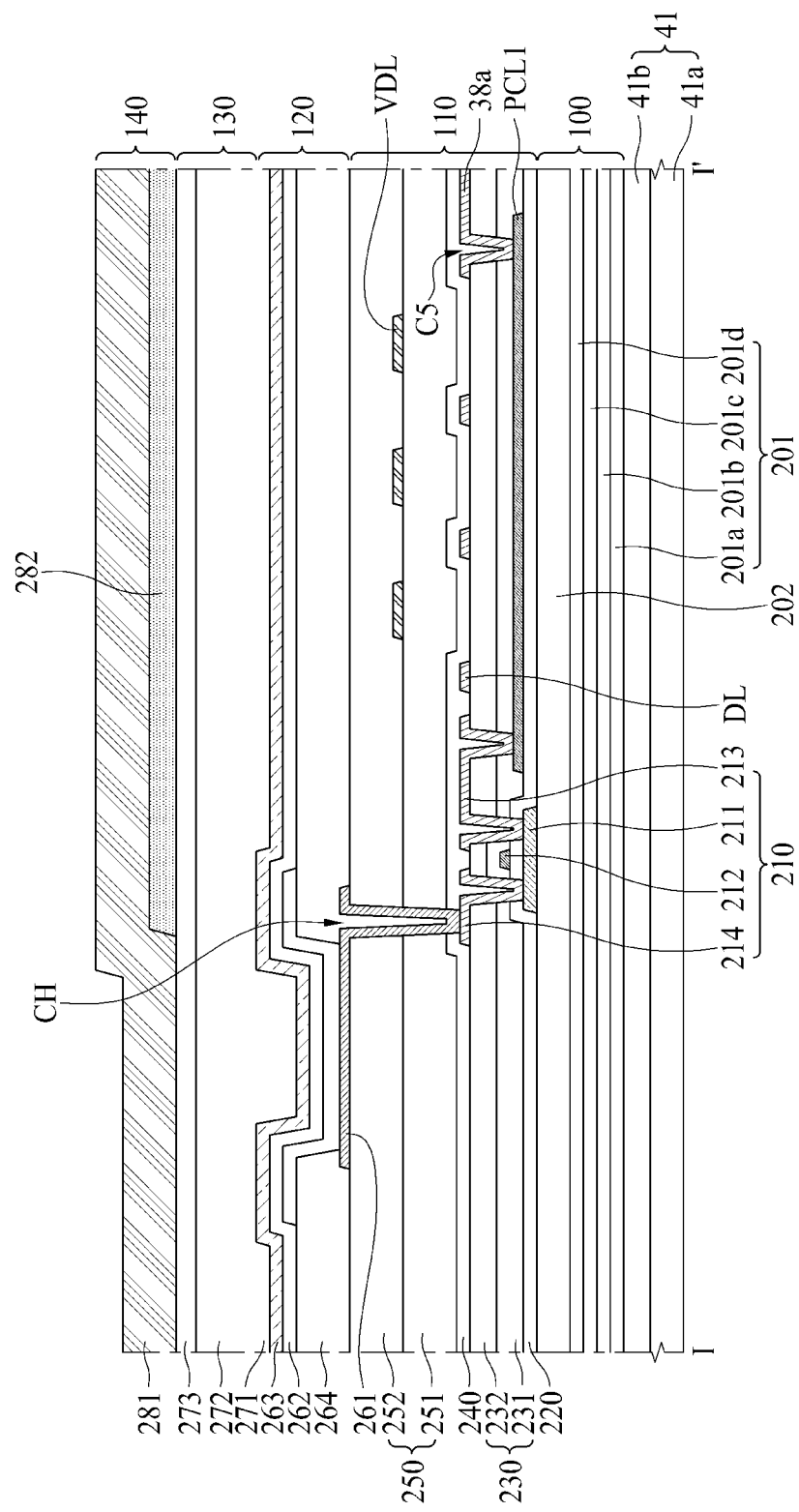
FIG. 15 is a cross-sectional view illustrating an example taken along line II-II' of FIG. 14.

FIG. 15 is a cross-sectional view illustrating an example taken along line II-II' of FIG. 14.

Except for that a first passive connection line PCL1 instead of a voltage connection line VCL is provided on a gate insulation layer 220 and a first passive data line 38a is provided on an interlayer insulation layer 230, description on the aspect of FIG. 15 is substantially the same as description given above with reference to FIG. 10. Hereinafter, therefore, for convenience of description, the first passive connection line PCL1 and the first passive data line 38a will be mainly described with reference to FIG. 15, and description overlapping FIG. 10 is omitted.

Referring to FIG. 15, a first passive connection line PCL1 may be provided on a gate insulation layer 220 along with a gate electrode 212 and a plurality of scan lines. The gate electrode 212, the scan lines, and the first passive connection line PCL1 may each be formed of a single layer or a multilayer which includes one of Mo, Al, Cr, Au, Ti, Ni, Nd, and Cu, or an alloy thereof.

A source electrode 213 may be connected to the first passive connection line PCL1 through a contact hole passing through an interlayer insulation layer 230. The first passive connection line PCL1 may intersect a plurality of data lines DL and a plurality of first source voltage lines VDL.

A first passive data line 38a may be provided on the interlayer insulation layer 230 along with the source electrode 213, a drain electrode 214, and the plurality of data lines DL. The first passive data line 38a may be connected to the first passive connection line PCL1 through a contact hole passing through the interlayer insulation layer 230. The source electrode 213, the drain electrode 214, the data lines DL, and the first passive data line 38a may each be formed of a single layer or a multilayer which includes one of Mo, Al, Cr, Au, Ti, Ni, Nd, and Cu, or an alloy thereof.

Figure 16:
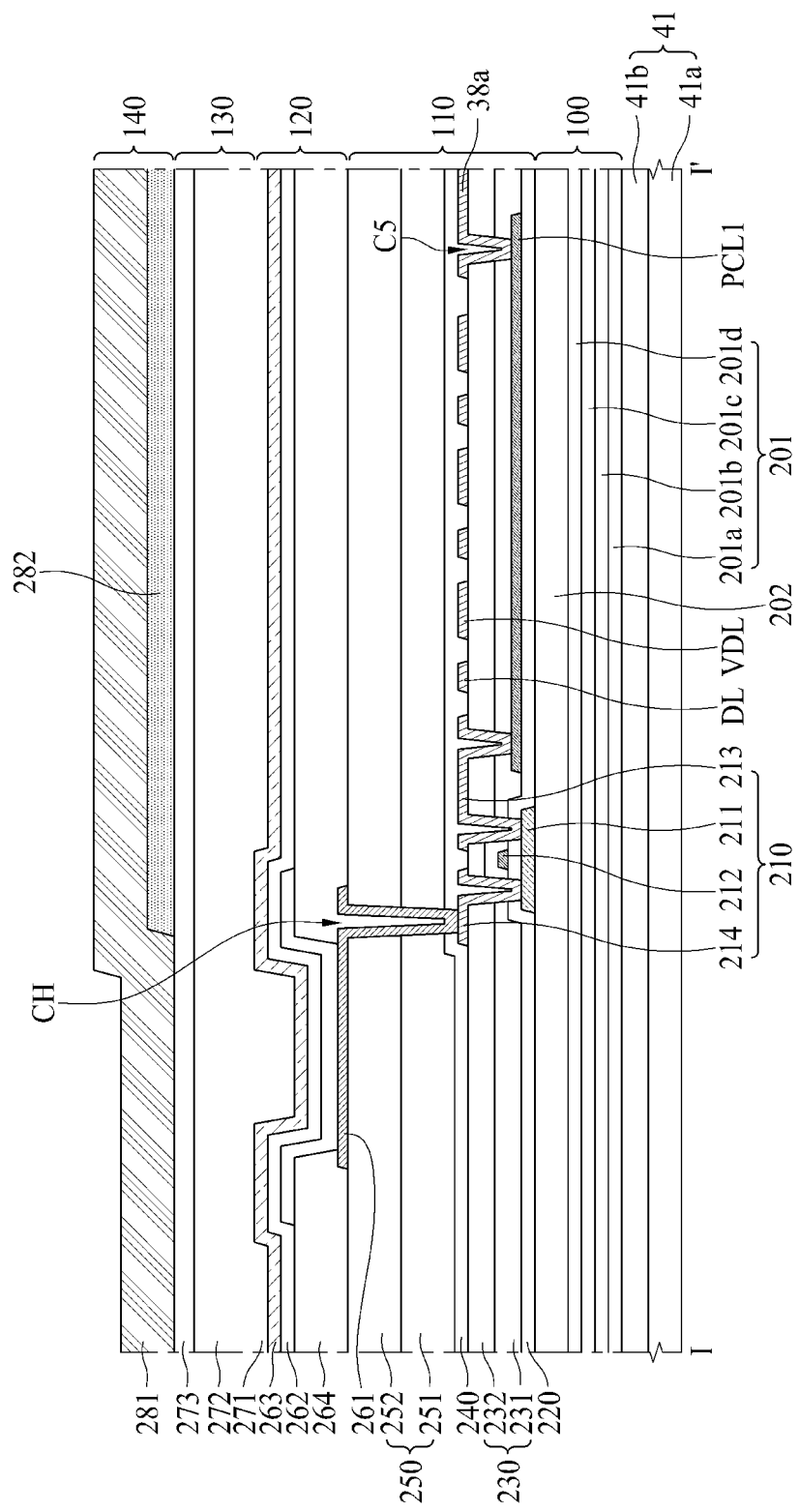
FIG. 16 is a cross-sectional view illustrating another example taken along line II-II' of FIG. 14.

FIG. 16 is a cross-sectional view illustrating another example taken along line II-II' of FIG. 14.

Except for that a first passive connection line PCL1 instead of a voltage connection line VCL is provided on a gate insulation layer 220, a first passive data line 38a is provided on an interlayer insulation layer 230, and a plurality of first source voltage lines VDL are provided on the interlayer insulation layer 230 instead of a first planarization layer 251, description on the aspect of FIG. 16 is substantially the same as description given above with reference to FIG. 10. Hereinafter, therefore, for convenience of description, the first passive connection line PCL1, the first passive data line 38a, and the first source voltage lines VDL will be mainly described with reference to FIG. 16, and description overlapping FIG. 10 is omitted.

Referring to FIG. 16, a first passive connection line PCL1 may be provided on a gate insulation layer 220 along with a gate electrode 212 and a plurality of scan lines. The gate electrode 212, the scan lines, and the first passive connection line PCL1 may each be formed of a single layer or a multilayer which includes one of Mo, Al, Cr, Au, Ti, Ni, Nd, and Cu, or an alloy thereof.

A source electrode 213 may be connected to the first passive connection line PCL1 through a contact hole passing through an interlayer insulation layer 230. The first passive connection line PCL1 may intersect a plurality of data lines DL and a plurality of first source voltage lines VDL.

A first passive data line 38a and the first source voltage lines VDL may be provided on the interlayer insulation layer 230 along with the source electrode 213, a drain electrode 214, and the plurality of data lines DL. The first passive data line 38a may be connected to the first passive connection line PCL1 through a contact hole passing through the interlayer insulation layer 230. Each of the first source voltage lines VDL may be connected to a corresponding voltage connection line VCL through a contact hole passing through the interlayer insulation layer 230. The source electrode 213, the drain electrode 214, the data lines DL, the first passive data line 38a, and the first source voltage lines VDL may each be formed of a single layer or a multilayer which includes one of Mo, Al, Cr, Au, Ti, Ni, Nd, and Cu, or an alloy thereof.

Figure 17:
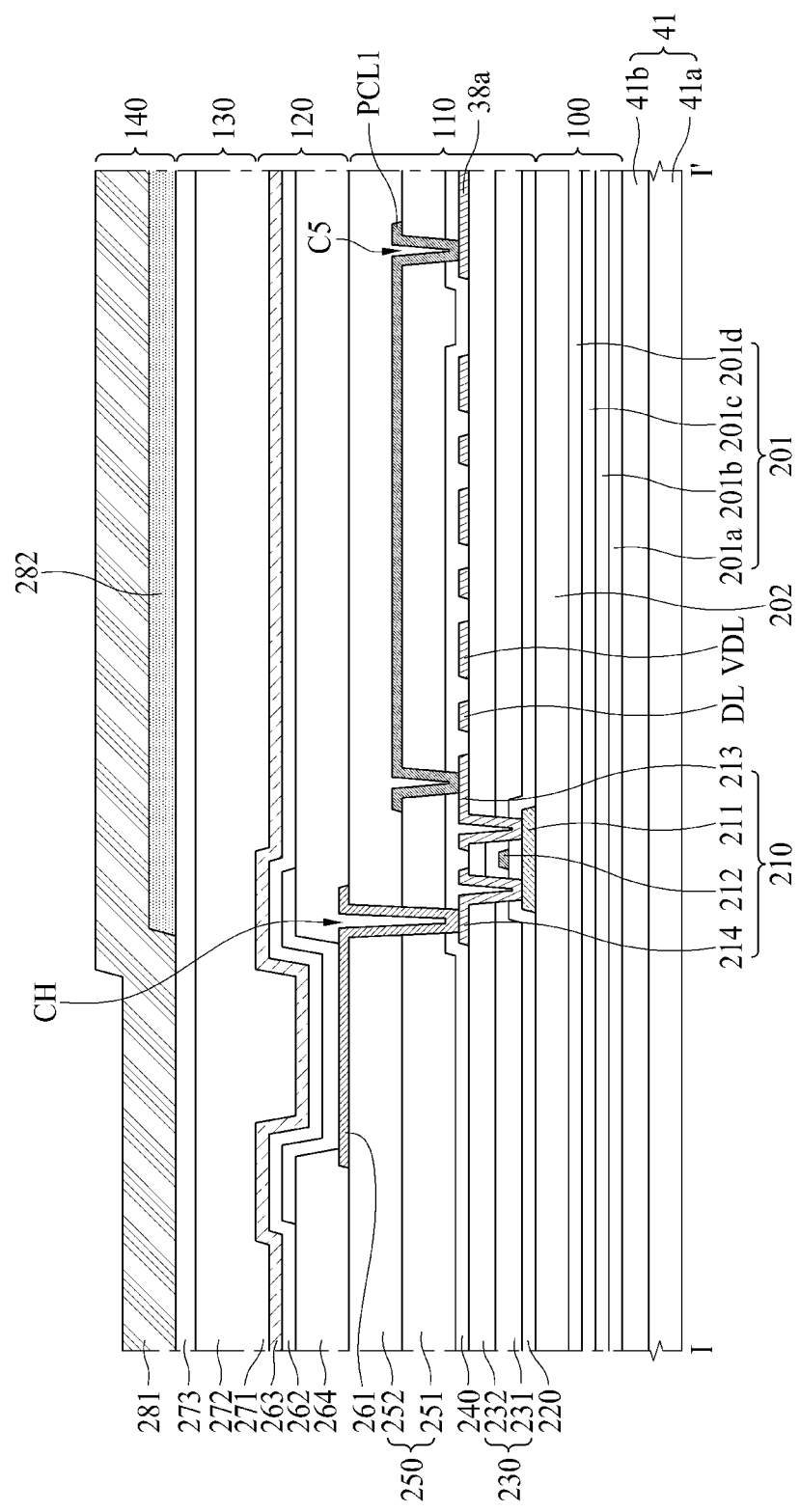
FIG. 17 is a cross-sectional view illustrating another example taken along line II-II' of FIG. 14.

FIG. 17 is a cross-sectional view illustrating another example taken along line II-II' of FIG. 14.

Except for that a first passive connection line PCL1 instead of a voltage connection line VCL is provided on a first planarization layer 251, a first passive data line 38a is provided on an interlayer insulation layer 230, and a plurality of first source voltage lines VDL are provided on the interlayer insulation layer 230 instead of the first planarization layer 251, description on the aspect of FIG. 17 is substantially the same as description given above with reference to FIG. 10. Hereinafter, therefore, for convenience of description, the first passive connection line PCL1, the first passive data line 38a, and the first source voltage lines VDL will be mainly described with reference to FIG. 17, and description overlapping FIG. 10 is omitted.

Referring to FIG. 17, a first passive connection line PCL1 may be provided on a first planarization layer 251. The first passive connection line PCL1 may each be formed of a single layer or a multilayer which includes one of Mo, Al, Cr, Au, Ti, Ni, Nd, and Cu, or an alloy thereof.

The first passive connection line PCL1 may be connected to a source electrode 213 through a contact hole which passes through the first planarization layer 251 and a passivation layer 240. The first passive connection line PCL1 may intersect a plurality of data lines DL and a plurality of first source voltage lines VDL.

The first source voltage lines VDL may be provided on the interlayer insulation layer 230 along with the source electrode 213, a drain electrode 214, and the plurality of data lines DL. The first passive data line 38a may be connected to the first passive connection line PCL1 through a contact hole passing through the first planarization layer 251 and a passivation layer 240. The source electrode 213, the drain electrode 214, the data lines DL, the first source voltage lines VDL and first passive data line 38a may each be formed of a single layer or a multilayer which includes one of Mo, Al, Cr, Au, Ti, Ni, Nd, and Cu, or an alloy thereof.

As described above, according to the aspects of the present disclosure, the folding part defined by the folding lines may not overlap the bending area bent by the bending line intersecting the folding lines. As a result, according to the aspects of the present disclosure, even when the flexible display apparatus is folded at the folding part, a crack is prevented from occurring in the bending area bent by the bending line intersecting the folding lines.

Moreover, according to the aspects of the present disclosure, a cross point of a bending line provided in the first direction and a bending line provided in the second direction intersecting the first direction may be disposed more outward than a corner between a bending area bent with respect to the bending line provided in the first direction and a bending area bent with respect to the bending line provided in the second direction. As a result, according to the aspects of the present disclosure, the bending area bent with respect to the bending line provided in the first direction may not overlap the bending area bent with respect to the bending line provided in the second direction. Therefore, according to the aspects of the present disclosure, since the bending area bent with respect to the bending line provided in the first direction does not overlap the bending area bent with respect to the bending line provided in the second direction, a crack caused by an overlap of the bending areas does not occur.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A flexible display apparatus including a cover substrate and a display module disposed on a rear surface of the cover substrate, the cover substrate comprising:
 a flat part;
 a first bending part bent at a first curvature from a first side of the flat part with respect to a first bending line;
 a folding part foldable with respect to a folding line; and
 a second bending part bent at a second curvature from a second side of the flat part with respect to a second bending line intersecting the first bending line,
 wherein the folding part does not overlap the first bending part and the first bending line and the second bending line are crossed at a point more outward than an edge of a corner between the first bending part and the second bending part.

2. The flexible display apparatus of claim 1, wherein the display module includes:
 a display area including a plurality of scan lines, a plurality of data lines and a plurality of first source voltage lines intersecting the plurality of scan lines, and a plurality of pixels respectively provided in a plurality of areas defined by intersections of the plurality of scan lines and the plurality of data lines; and
 a scan driver including a plurality of stages respectively outputting scan signals to the plurality of scan lines,
 wherein the display area is disposed on the flat part and the first bending part, and the scan driver is disposed outside the display area and is disposed on the flat part and the first bending part.

3. The flexible display apparatus of claim 2, wherein the cover substrate further comprises a concave portion recessed from an edge of the first side, wherein the scan driver is disposed on the flat part in the concave portion.

4. The flexible display apparatus of claim 3, further comprising a plurality of pixels provided on the concave portion, wherein the plurality of pixels and the plurality of stages of the scan driver are arranged in a stair form.

5. The flexible display apparatus of claim 3, wherein the display module further comprises a first source voltage supply line disposed between the display area and the scan driver, wherein the first source voltage supply line is disposed on the flat part and the first bending part.

6. The flexible display apparatus of claim 5, wherein the first source voltage supply line is disposed on the flat part in the concave portion.

7. The flexible display apparatus of claim 3, wherein the display module further comprises a non-display area where a plurality of pixels are not provided on the concave portion.

8. The flexible display apparatus of claim 7, wherein an interval between adjacent data lines of the plurality of data lines in the non-display area is narrower than an interval between adjacent data lines of the plurality of data lines in the display area.

9. The flexible display apparatus of claim 7, wherein the plurality of data lines crosses the non-display area, and the plurality of first source voltage lines do not cross the non-display area.

10. The flexible display apparatus of claim 9, wherein the display module further comprises a plurality of voltage connection lines connecting the plurality of first source voltage lines to the first source voltage supply line.

11. The flexible display apparatus of claim 10, wherein the plurality of voltage connection lines intersect the plurality of data lines.

12. The flexible display apparatus of claim 3, wherein the display module further comprises:
- a passive pixel part including a plurality of passive pixels in the concave portion; and
- a plurality of passive data lines transmitting passive data voltages to the plurality of passive pixels.

13. The flexible display apparatus of claim 12, wherein the plurality of passive data lines are disposed between the passive pixel part and the first source voltage supply line and are disposed in the flat part and the first bending part.

14. The flexible display apparatus of claim 13, wherein the plurality of passive data lines are disposed on the flat part in the concave portion.

15. The flexible display apparatus of claim 12, wherein the display module further comprises a plurality of passive connection lines respectively connecting the plurality of passive pixels to the plurality of passive data lines.

16. The flexible display apparatus of claim 15, wherein the plurality of passive connection lines intersect the plurality of data lines.

17. The flexible display apparatus of claim 15, wherein the plurality of passive pixels includes a plurality of first passive pixels emitting light having a first color, a plurality of second passive pixels emitting light having a second color and a plurality of third passive pixels emitting light having a third color,
- wherein the plurality of passive connection lines includes a plurality of first passive connection lines respectively connecting the plurality of first passive pixels to the plurality of first passive data lines, a plurality of second passive connection lines respectively connecting the plurality of second passive pixels to the plurality of second passive data lines, and a plurality of third passive connection lines respectively connecting the plurality of third passive pixels to the plurality of third passive data lines, and
- wherein the plurality of passive data lines includes a plurality of first passive data lines for supplying first passive data voltages to the plurality of first passive pixels, a plurality of second passive data lines for supplying second passive data voltages to the plurality of second passive pixels, and a plurality of third passive data lines for supplying third passive data voltages to the plurality of third passive pixels.

18. The flexible display apparatus of claim 17, wherein the plurality of first passive pixels connected to one of the plurality of scan lines among the plurality of first passive pixels is connected to one of the plurality of first passive connection lines in common.

\* \* \* \* \*